United States Patent [19]
Hirao

[11] Patent Number: 6,087,708
[45] Date of Patent: Jul. 11, 2000

[54] SEMICONDUCTOR INTEGRATED CIRCUIT DEVICE AND A METHOD OF PRODUCING THE SAME

[75] Inventor: Tadashi Hirao, Itami, Japan

[73] Assignee: Mitsubishi Denki Kabushiki Kaisha, Tokyo, Japan

[21] Appl. No.: 08/907,477

[22] Filed: Aug. 11, 1997

Related U.S. Application Data

[63] Continuation of application No. 08/764,132, Dec. 12, 1996, abandoned, which is a continuation of application No. 08/310,067, Sep. 23, 1994, abandoned, which is a continuation of application No. 07/884,228, May 11, 1992, abandoned, which is a continuation of application No. 07/630,770, Dec. 21, 1990, abandoned, which is a continuation of application No. 07/290,273, Dec. 27, 1988, abandoned, which is a division of application No. 07/079,708, Jul. 30, 1987, Pat. No. 4,812,417.

[30] Foreign Application Priority Data

Jul. 30, 1986 [JP] Japan ................................ 61-179738
Aug. 6, 1986 [JP] Japan ................................ 61-185732
Nov. 7, 1986 [JP] Japan ................................ 61-266452

[51] Int. Cl.[7] .................................................. H01L 27/082
[52] U.S. Cl. .......................... 257/565; 257/588; 257/592; 257/755; 257/506
[58] Field of Search ................................. 357/59 H, 59 I, 357/34; 257/565, 588, 592, 755, 506

[56] References Cited

U.S. PATENT DOCUMENTS

| | | | |
|---|---|---|---|
| 4,157,269 | 6/1979 | Ning et al. ............................. | 357/59 H |
| 4,481,706 | 11/1984 | Roche ....................................... | 29/577 |
| 4,546,536 | 10/1985 | Anantha et al. ....................... | 357/59 H |
| 4,581,319 | 4/1986 | Wieder et al. ........................... | 430/314 |
| 4,686,762 | 8/1987 | Chai et al. .............................. | 357/59 H |
| 4,686,763 | 8/1987 | Thomas et al. ........................ | 357/59 H |
| 4,705,599 | 11/1987 | Suda et al. .............................. | 357/34 |
| 4,712,125 | 12/1987 | Bhatia et al. ........................... | 257/588 |
| 4,728,618 | 3/1988 | Hirao ...................................... | 357/50 |
| 4,729,965 | 3/1988 | Tamaki et al. ........................... | 357/34 |
| 4,753,709 | 6/1988 | Welch et al. ............................ | 357/59 I |
| 4,772,566 | 9/1988 | Zdebel et al. ............................ | 357/34 |
| 4,780,427 | 10/1988 | Sakai et al. .............................. | 257/754 |
| 4,782,030 | 11/1988 | Katsumata et al. ....................... | 437/33 |
| 4,784,971 | 11/1988 | Chiu et al. ............................... | 357/59 H |

FOREIGN PATENT DOCUMENTS 0260058  9/1987  European Pat. Off. .

*Primary Examiner*—Mark V. Prenty

[57] ABSTRACT

A semiconductor integrated circuit device includes a bipolar transistor having a semiconductor layer which will have a collector region, a base region provided at the surface of the semiconductor layer, and an emitter region provided at the surface of the base region. The device includes a first silicon film for connecting an external base layer with a base electrode of the transistor, and a first silicide film produced on the surface of the first silicon film, and a second silicon film for connecting an emitter layer with an emitter electrode of the transistor and a second silicide film produced on the surface of the second silicon film.

19 Claims, 21 Drawing Sheets

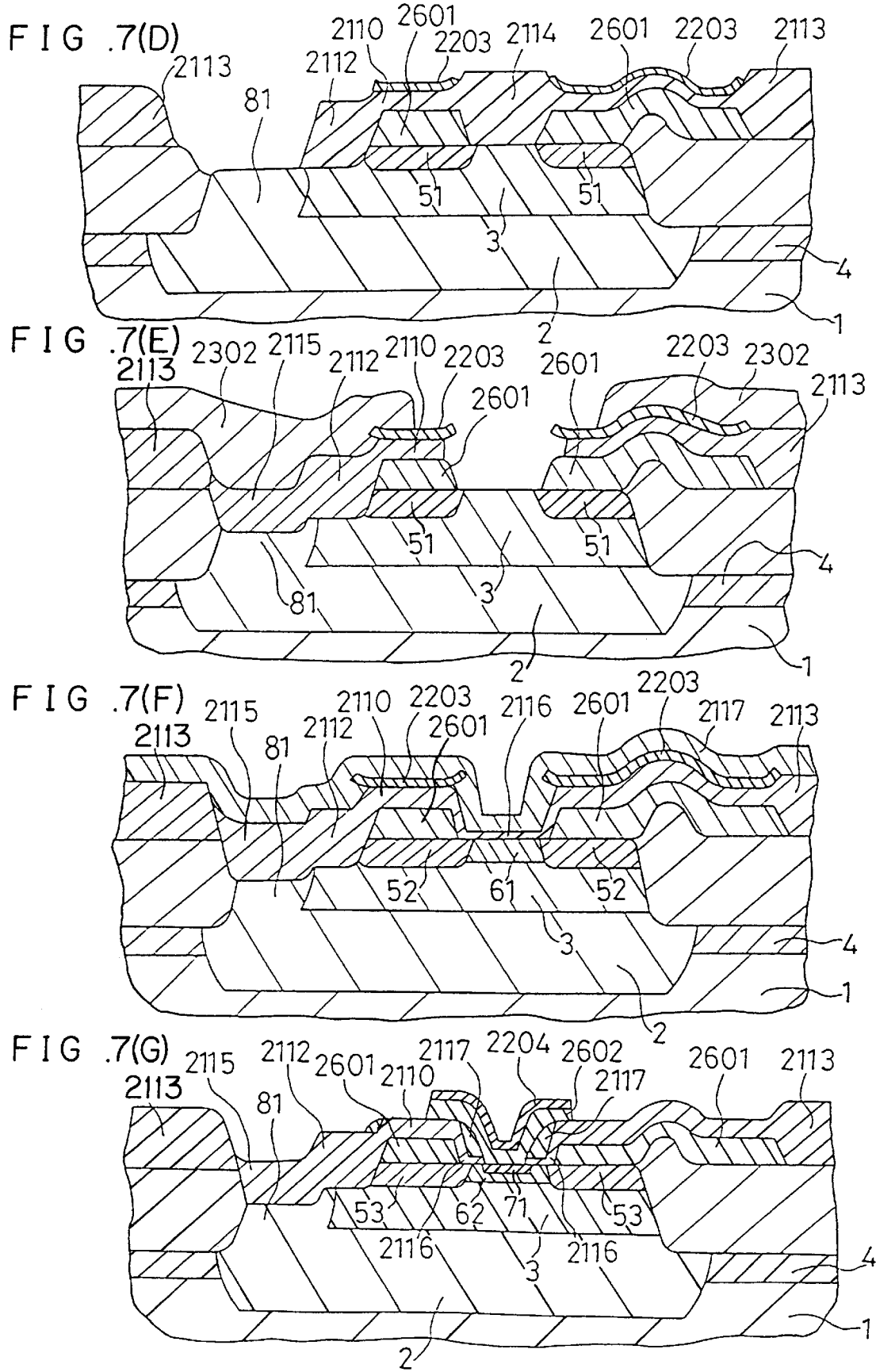

FIG. 10(D) (PRIOR ART)
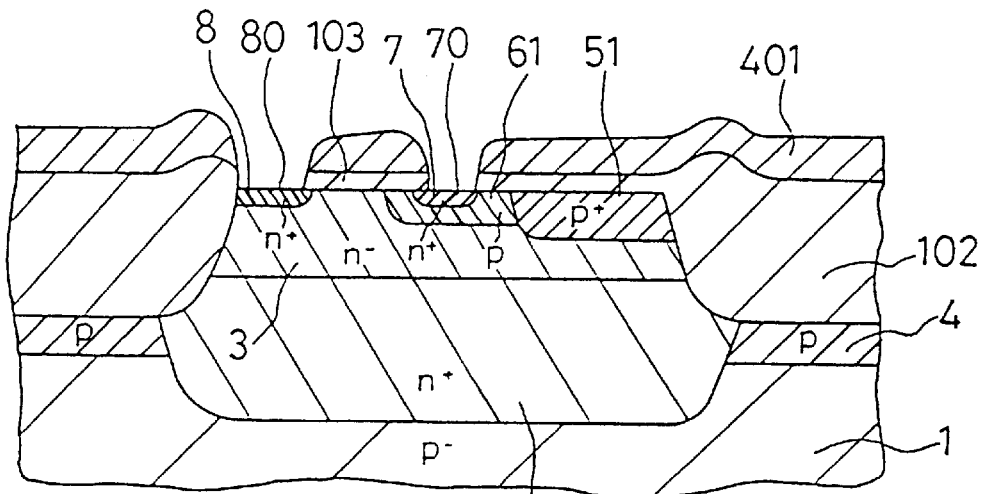
FIG. 10(E) (PRIOR ART)
FIG. 11 (PRIOR ART)
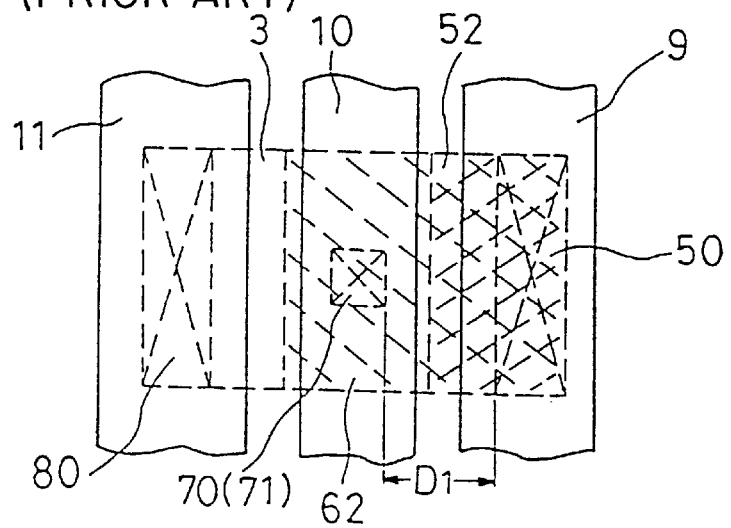

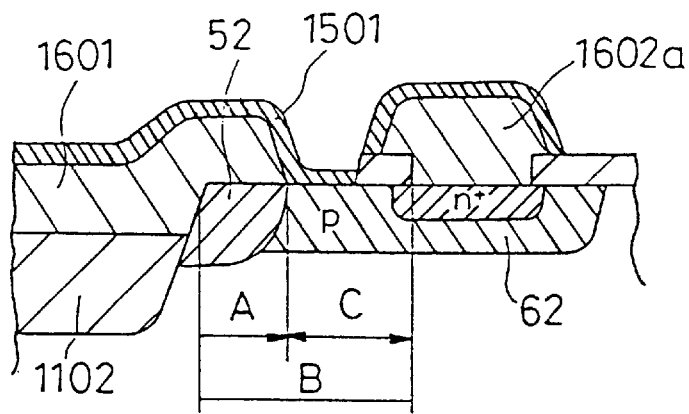
FIG. 15(A)
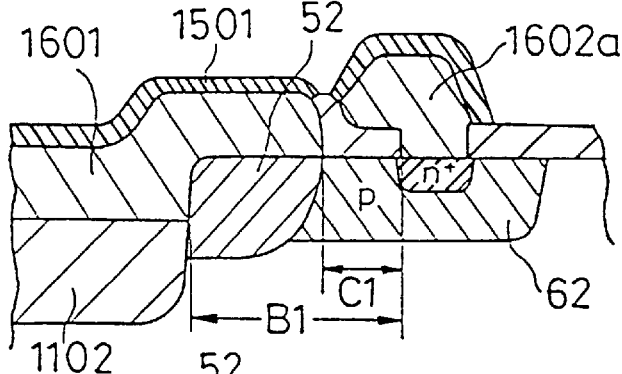
FIG. 15(B) (PRIOR ART)
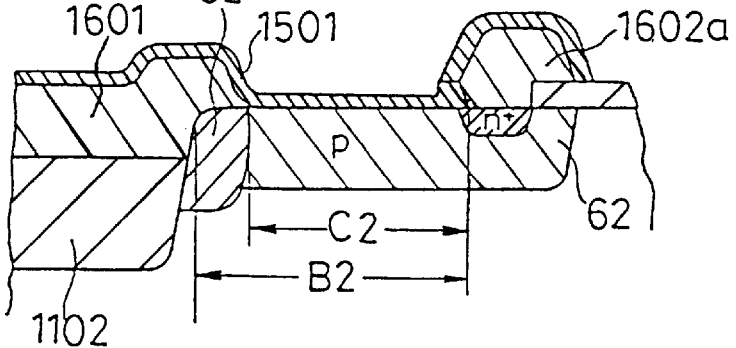
FIG. 15(C) (PRIOR ART)
FIG. 17 (PRIOR ART)
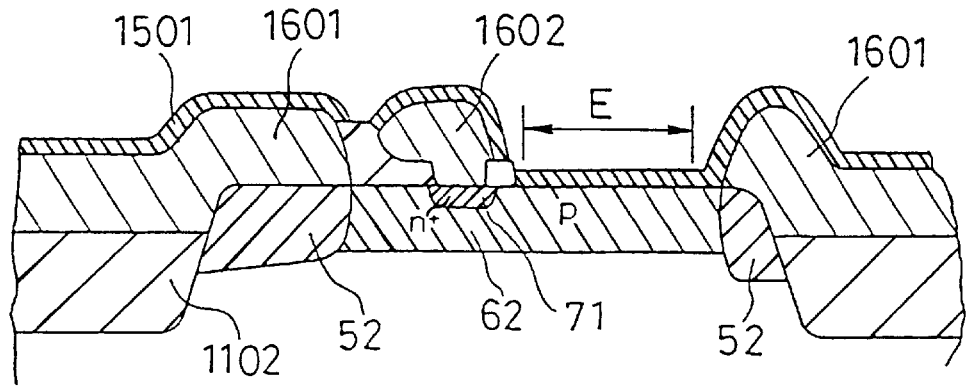

SEMICONDUCTOR INTEGRATED CIRCUIT DEVICE AND A METHOD OF PRODUCING THE SAME

This application is a continuation of prior application Ser. No. 08/764,132 filed on Dec. 12, 1996 now abandoned, which is a Rule 62 continuation of Ser. No. 08/310,067, filed on Sep. 23, 1994 now abandoned, which is a Rule 62 continuation of Ser. No. 07/884,228 filed May 11, 1992 now abandoned, which is a Rule 62 continuation of Ser. No. 07/630,770 filed Dec. 21, 1990 now abandoned, which is a Rule 62 continuation of Ser. No. 07/290,273 filed Dec. 27, 1988 now abandoned, which is a Rule 60 divisional of Ser. No. 07/079,708 filed Jul. 30, 1987 now U.S. Pat. No. 4,812,417.

FIELD OF THE INVENTION

The present invention relates to a semiconductor integrated circuit device and a method of producing the same, and more particularly to an improvement in an emitter portion and a base electrode leading out portion in a bipolar type semiconductor integrated circuit device.

BACKGROUND ART

Generally, transistors in a bipolar type semiconductor integrated circuit device are produced in an electrically independent island that is separated from adjacent transistors by a pn junction separation method, an oxide film separation method using a selective oxidation technique, or a method utilizing a triple diffusion. Herein, a method of producing an npn transistor by an oxide film separation method will be described. Of course, various separation methods other than this separation method can be used, and transistors may be of pnp types.

FIGS. 10(A) to (E) show the cross-sectional structures of a prior art semiconductor integrated circuit device at major process steps in a prior art production method. The prior art production method will be briefly described in the following paragraphs.

At first, a high impurity density n type ($n^+$ type) layer 2, which will become a collector embedded layer, is selectively produced on a low impurity density p type ($p^-$ type) silicon substrate 1. Next, an $n^-$ type epitaxial layer 3 will be produced on the silicon substrate 1 and the $n^+$ type layer 2 (FIG. 10(A)).

Thereafter, an underlying oxide film 101 and a nitride film 201 are produced on a predetermined region of the $n^-$ layer 3, and a channel cutting p type layer 4 is annealed by using the nitride film 201 as a mask. At the same time, a thick separation oxide film 102 is produced by using the nitride film 201 as a mask (FIG. 10(B)).

Next, the nitride film 201, which has been used as a mask at first for the selective oxidation, is removed together with the underlying oxide film 101. Thereafter, an oxide film 103 for ion injection protection is again produced, and a $p^+$ type layer 5, which will become an external base layer, is produced by using the photoresist film (the photoresist film at this step is not shown) as a mask. Furthermore, the above-described photoresist film is removed, and a photoresist film 301 is again produced in a predetermined configuration, and a p type layer 6 which becomes an active base layer is produced by an ion injection method by using the photoresist film 301 as a mask (FIG. 10(C)).

Subsequently, the photoresist film 301 is removed, and a passivation film 401 generally comprising phosphorous silicate glass coats the surface. A thermal processing is conducted which functions by annealing the base ion injection layers 5 and 6 and sintering the PSG film 401, and an intermediate stage external base layer 51 and an intermediate stage active base layer 61 are produced. Next, an emitter electrode contact hole 70 and a collector electrode contact hole 80 are produced at predetermined regions of the PSG film 401, and an $n^+$ type layer 7 which will become an emitter layer and an $n^+$ type layer 8 which will become a collector electrode leading out layer are produced by an ion injection method through the contact holes 70 and 80 (FIG. 10(D)).

Thereafter, the respective ion injection layers are annealed, the external base layer 52 and the active base layer 62 are completed, and the emitter layer 71 and the collector electrode leading out layer 81 are produced. Furthermore, a metal silicide film 501 for preventing the electrode extrusion (such as preventing the reaction between aluminum and silicon) is produced at the respective holes 50, 70 and 80 of the PSG film 401. For this metal silicide film 501, platinum silicide (Pt—Si) or palladium silicide (Pd—Si) are used. Thereafter, a base electrode wiring 9, an emitter electrode wiring 10, and a collector electrode wiring 11 are produced by using a low resistance metal such as aluminum on the metal silicide film 501 (FIG. 10(E)).

The frequency characteristics of a transistor depends on the base-collector capacitance and base resistance, and therefore it is necessary to lower these parameters in order to enhance the frequency characteristics of a transistor. The $p^+$ type external base layer 52 in the above-described prior art structure is provided so as to lower the base resistance. However, the position of this external base layer 52 is determined by the overlapping in the photolithography process that does not self align with the emitter layer 71, and therefore it has to be produced to some extent apart therefrom which results in the remaining high resistance base layer 62 of a wide region. This result prevents the base resistance from being lowered as much as expected.

Furthermore, the base resistance depends on the distance D1 between the emitter layer 71 and the base electrode leading out aperture 50 as shown in the plain pattern of the transistor produced by the prior art method of FIG. 11. In the prior art device, the distance D1 is the sum of the interval between the base electrode wiring 9 and the emitter electrode wiring 10 and the lengths of the portions of the electrode wirings 9 and 10 extending out from the respective apertures 50 and 70 thereof. Thus, even if the preciseness of the photo etching is enhanced to narrow the electrode wiring interval, the above-described extending out portions inevitably remain, and the base resistance cannot be lowered as much.

Furthermore, although such a double base structure as shown in FIG. 6 is frequently constituted as a method of reducing the base resistance, there are disadvantages that the base region increases due to the leading out of the base electrode, and an increase in the base collector capacitance results.

Furthermore, in the prior art method the plain pattern of the emitter diffusion layer 71 is dependent on the photolithography preciseness. Although the photolithography preciseness of about 1 micron is put into practice by the present highest level photolithography technique, the technique requires a high performance photolithography device and it is quite difficult to produce a further fine pattern. Herein, the reduction of the width of the emitter diffusion layer (emitter width) reduces the emitter area as well the capacitance of an emitter base junction, and further reduces a base resistance (R. M. Warner and J. N. Fordemwolt, "Integrated Circuits," pp. 103–109, McGraw-Hill, New York, 1985). Accordingly, although fine patterning of the emitter width is required in order to improve the frequency characteristics, there was a problem that the fine patterning of the emitter width is restricted by the photolithography preciseness in the prior art method.

FIG. 13(A) to FIG. 13(I) show cross-sectional views at the major production process steps of a second prior art method of producing a semiconductor integrated circuit device. This second prior art production method will be described in the following paragraphs.

FIG. 13(A)

At first, a high impurity density n type ($n^+$ type) layer 2, which becomes a collector embedded layer, is selectively produced on a low impurity density p type ($p^-$ type) silicon substrate 1. Thereafter, a low impurity density n type ($n^-$ type) epitaxial layer 3 is grown thereon.

FIG. 13(B)

An underlying oxide film 1101 is produced on the epitaxial layer 3, and a nitride film 1201 having a predetermined configuration is produced on the underlying oxide film 1101. A thick separation oxide film 1102 is produced by conducting a selective oxidation by using the nitride film 1201 as a mask. At the same time, a channel cutting p type layer 4 is produced below the separation oxide film 1102.

FIG. 13(C)

After removing the nitride film 1201 which has been used as a selective oxidation mask together with the underlying oxide film 1101, an oxide film 1103 for ion injection protection is produced again. A p type layer 6 which will become an active base layer is produced by conducting an ion injection by using a photoresist film produced on the oxide film 1103 as a mask (the photoresist film at this step is not shown). Thereafter, an oxide film 1103 at the neighborhood of the region which will become a base electrode aperture is removed. Next, a silicon film 1601 is coated over the exposed entire surface. Herein, a monocrystalline silicon film, a polycrystalline silicon film, or an amorphous silicon film is used as the silicon film.

FIG. 13(D)

An intermediate stage active base region 61 is produced at the p type layer 6 by conducting a sintering process after introducing p type impurities into the entire surface of the silicon film 1601. At the same time, an external base region 51 is produced by conducting an impurity diffusion from the p type impurities included in the silicon film 1601. Thereafter, the silicon film 1601 is selectively etched and removed, and a silicon film remains on the external base region 51 and the separation oxide film 1102. An oxide film 1105 is produced on a position where the oxide film 1103 has been produced, and an oxide film 1106 is produced over the remaining silicon film 1601 by again conducting an oxidation process, and a phosphorous silicate glass film 1401 is produced on the entire surface.

FIG. 13(E)

In conducting a selective etching by using a photoresist film (not shown), mask apertures are produced by removing the oxide film 1105 and the PSG film 1401 on the regions which are to be an emitter layer and a collector electrode leading out layer. Next, a silicon film 1602 is coated over the entire surface, n type impurities are ion injected into the silicon film 1602 at a high concentration. Next, driving of injected impurities is conducted to diffuse impurities into the substrate surface from the silicon film 1602. Thereby, an n+type layer 71 is produced which will become an emitter layer and an $n^+$ type layer 81 is produced which will become a collector electrode leading out layer. Then, impurities are also driven to the external base region 51 to produce an external base region 52.

FIG. 13(F)

A selective etching of the silicon film 1602 is conducted so that the silicon film portions 1602*a* and 1603, which will become impurity diffusion sources, remain. Next, aperturing of a contact hole for a base contact is conducted by using the resist film 1302, which is patterned in a predetermined configuration, as a mask. Then, the resist film 1302 is produced to expose a portion of the silicon film 1602*a* for producing the emitter layer, the base contact and the oxide film 1106 and the PSG film 1401 on the silicon film 1601 following the base contact which is etched and removed by using the exposed silicon film 1602*a* as a mask.

FIG. 13(G)

An oxidation at a low temperature (about 800° C. to 900° C.) is conducted to produce a thick oxide film 1108 on the polysilicon films 1602*a* and 1603 and the $n^+$ layers 71 and 81, and a thin oxide film 1107 on the p type region 62 and the $p^+$ type silicon film 1601. This is produced with the use of the well known fact that the lower the temperature is, the more the acceleration oxidation is conducted in the silicon substrate and in the silicon film including phosphor and arsenic at n type impurities at a high concentration.

FIG. 13(H)

Only the thin oxide film 1107 is washed out. Next, a metal layer (not shown) is produced by the use of a vapor plating method or a sputtering method on the entire surface with the use of metals such as Pt, Pd, Ti, W, and Mo which produce a metal silicide with silicon or polysilicon film. Thereafter, a sintering process is conducted to produce metal silicide films 1501 and 1502 on the exposed surface of the silicon substrate and the silicon film 1601. Thereafter, the metal layer is removed by etching, such as aqua regia, so that the metal silicide film remains.

FIG. 13(I)

After a passivation nitride film 1202 (an oxide film may be used) is coated over, selective etching is executed to the nitride film 1202 and the thick oxide film 1108. The base electrode contract hole 50, the emitter electrode contact hole 70, and the collector electrode contact hole 80 are apertured. Next, a base electrode wiring 9, an emitter electrode wiring 10, and a collector electrode wiring 11 are respectively produced by using low resistance metal such as aluminum.

FIG. 14 shows a plain pattern of a transistor produced through the production process shown in FIG. 13(A) to FIG. 13(I). In FIG. 14, the distance C designates a distance between the emitter layer 71 and the polysilicon film 1601 connected to the base electrode 9, and the distance D designates a distance between the emitter layer 71 and the separation oxide film 1102. The photolithography for the aperturing, which produces the emitter layer 71 (production of the aperture portion), is conducted in alignment with either of the patterns of the separation oxide film 1102 or the polysilicon film 1601, and the interval between either of them and the emitter layer 71 must be made larger than the overlapping margin of the photolithography (an overlapping margin corresponding to twice the photolithography is required). Because the photolithography for the aperturing which produces the emitter layer 71 is generally conducted in alignment with the pattern of the separation oxide film 1102, it is necessary to increase the distance C (to a larger value than about twice of the overlapping margin). This increase in the distance C causes an increase in the base area and results in increases of a base collector capacitance.

FIG. 15 shows cross-sections illustrating variations in the distance between the emitter layer and the polysilicon film, which is connected to the base electrode, caused by the overlapping preciseness of the photolithography. The dependency of the distance C on the photolithography overlapping preciseness will be described in the following paragraphs.

As shown in FIG. 15(A), usually the polysilicon film 1601, which will become a base electrode, is aligned by photolithography with the separation edge (the end portion of the separation oxide film 1102) as shown in the drawing by an arrow A. The emitter contact is also aligned by photolithography with the separation edge (arrow B), and the silicon film 1602a, which will become an emitter electrode, is aligned by photolithography with the contact pattern. Accordingly, the distance between the silicon films (corresponding to the distance C of FIG. 14) is determined by the overlapping preciseness of the photolithography. In the worst case, the inter-silicon film distance C greatly varies in a range from below half to three times of the distance in the normal case as shown in FIGS. 15(B) and (C).

FIG. 16 shows a plain pattern of a transistor which adopts a double base structure having the above-described distances C at both sides of the emitter so that the variation of the above-described distance C is suppressed.

In this double base structure, an active base region 62 surrounds the emitter layer 71. The silicon films 1601 on the external base region are produced between the emitter layer and are connected to the base electrode wiring 11 through both side contact holes 50.

FIG. 17 shows a cross-sectional structure of a transistor element having a double base structure which is obtained by the photolithography in the production of the emitter layer in a case where the worst photolithography is conducted. Even when the photolithography overlapping in the production of the emitter layer becomes worse as shown in FIG. 17, by adopting a double base structure as shown in FIG. 16, the distance E between the silicon film 1601, which is connected to the base electrode, and the emitter diffusion layer 71 is required to be set at the same value as designed. When such a double base structure is adopted, the inter-silicon film interval C (the distance between the emitter layer and the silicon film which is connected to the base electrode) becomes one including the photolithography overlapping margin, and the incremental portion of the extra base area approximately doubles by adopting such a double base structure. This becomes a heavy obstruction to the enhancement of the frequency characteristics in the transistor element.

SUMMARY OF THE INVENTION

An object of the present invention is to provide an improved semiconductor integrated circuit device and a method of producing the same having improved frequency characteristics due to having a low base resistance, a low base-collector capacitance, a narrow emitter width and a low emitter base capacitance.

A second object of the present invention is to provide a semiconductor integrated circuit device and a method of producing the same having improved frequency characteristics due to a short distance between the emitter layer and the silicon film connected to the base electrode and a reduced base area.

Other objects and advantages of the present invention will become apparent from the detailed description given hereinafter. It should be understood, however, that the detailed description and specific embodiments are given by way of illustration only, since various changes and modifications within the spirit and scope of the invention will become apparent to those skilled in the art from this detailed description.

According to an aspect of the present invention, silicide films are produced on the silicon films which connect between the base layer and the base electrode and between the emitter layer and the emitter electrode, respectively. Whereby, the wiring resistance between the external base layer and the base electrode is reduced to a great extent, and the emitter electrode can be led out to a region other than a region directly above the emitter layer without increasing the wiring resistance.

Furthermore, an active base layer is produced by self-alignment and an emitter layer is produced in the active base layer by self-alignment, whereby an external base layer is produced at a minimum separation distance from the emitter layer without being in contact with the same. Because only an insulating film is provided between the emitter layer and the base electrode leading out silicon film, the emitter-base interval is reduced to a value approximately equal to the film thickness of the insulating film. Furthermore, the emitter diffusion window width becomes shorter by the film thickness of the insulating film and an emitter region of a smaller width than the pattern size which is obtained by the photolithography. A low resistance base electrode leading out region comprising the first silicon film can be produced in self-alignment at the periphery of the emitter-silicon film by a patterning mask such as a second silicon film which becomes an emitter region diffusion source and is connected to a metal electrode.

According to a second aspect of the present invention, an external base is produced by impurity diffusion from a silicon film and the oxide film region surrounded by this silicon film determines the active base layer. The oxide film produced between the collector electrode leading out layer and the external base layer determines the end portion of the separation region of the transistor, and the photolithography for the production of the emitter layer comprises one time photolithography aligned with the silicon film pattern. Thus, the distance between the emitter layer and the silicon film connected to the base electrode and the distance between the emitter layer and the separation edge are reduced, so that a reduction in the base area results.

According to a third aspect of the present invention, an external base region is produced by an impurity diffusion from a silicon film. An active base layer is self-aligned with this silicon film, and a diffusion aperturing for the production of the emitter layer is self-aligned with the silicon film pattern. Thus, the oxide film produced between the collector electrode leading out layer and the external base layer determines the end portion of the separation region of the transistor. The distance between the emitter layer and the silicon film connected to the base electrode and the distance between the emitter layer and the separation edge are reduced to a great extent, thereby reducing the base area.

BRIEF DESCRIPTION OF THE DRAWINGS

The present invention will become more fully understood from the detailed description given hereinbelow and the accompanying drawings which are given by way of illustration only, and thus, are not limitative of the present invention, and wherein:

FIGS. 7(A) to (I) are diagrams showing the cross-sectional structures at major process steps of a method for producing a semiconductor integrated circuit device in a third embodiment of the present invention;

FIGS. 10(A) to (E) are diagrams showing cross-sectional structures of a semiconductor integrated circuit device at major process steps of a prior art production method;

FIG. 11 is a diagram showing a plain pattern of a transistor which is produced through the prior art method;

FIGS. 15(A) to (C) are diagrams showing cross-sectional structures of a transistor of a double base structure produced through the second prior art method;

FIG. 17 is a diagram showing the distance variation between the emitter layer and the separation region end portion and the distance variation between the emitter layer and te silicon film connected to the base electrode due to the overlapping preciseness of the photolithography for the transistor shown in FIG. 16.

DETAILED DESCRIPTION OF THE PREFERRED EMBODIMENTS

In order to explain the embodiments of the present invention in detail, reference will be particularly made to FIG. 1.

Figure 10A:
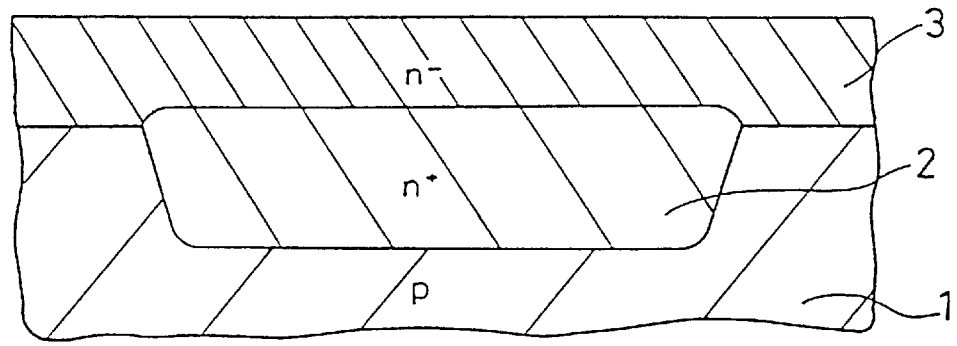
Figure 10B:
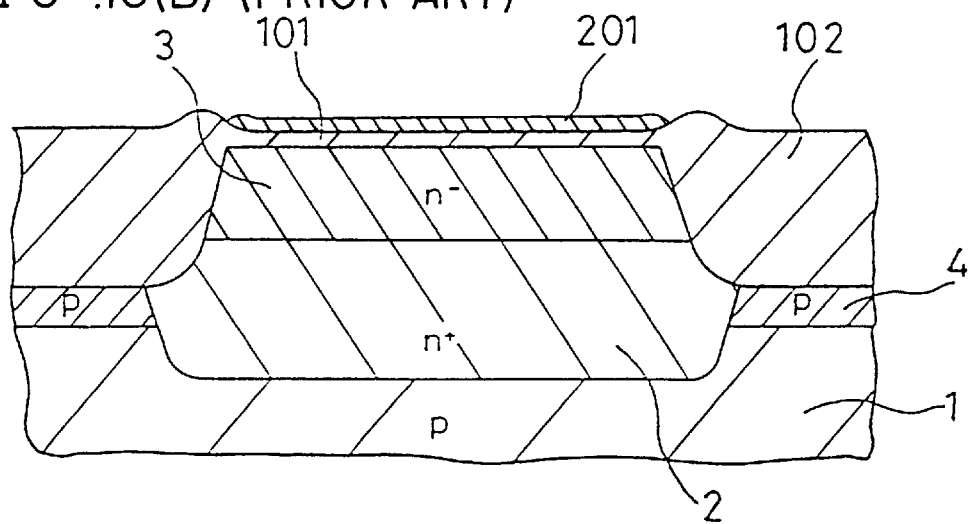
Figure 10C:
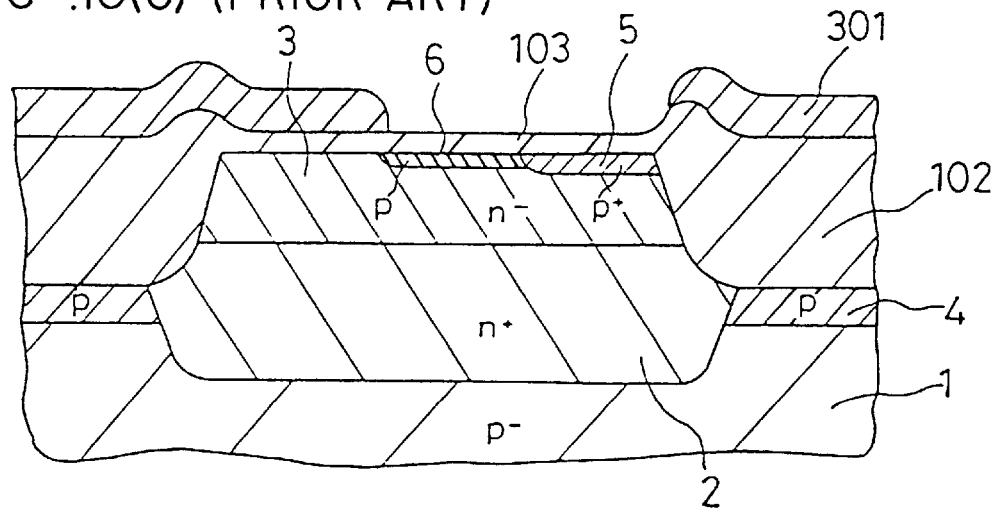

FIGS. 1(A) to (D) show cross-sectional structures at the major process steps of a method for producing a semiconductor integrated circuit device in a first embodiment of the present invention. In FIG. 1, the same reference numerals as used in FIG. 10 designate the same or corresponding elements. The reference numeral 1600 designates a polysilicon film, the reference numeral 1104 designates an oxide film, the reference numeral 1202 designates a nitride film, the reference numeral 1105 designates a selective oxide film, the reference numeral 1601 designates a $p^+$-polysilicon film, the reference numeral 51 designates an external base layer, the reference numeral 1106 designates an oxide film, the reference numeral 1302 designates a photoresist film, the reference numeral 1107 designates a thick oxide film, the reference numeral 1108 designates a thin oxide film, the reference numeral 61 designates an active base layer, the reference numeral 71 designates an emitter layer, the reference numerals 1502, 1503, and 1504 designate silicide films.

The method of producing the device will be described with reference to FIGS. 1(A) to (G).

FIG. 1(A)

At first, an $n^+$ type collector embedded layer 2, an $n^-$ type epitaxial layer 3, a channel cutting p type layer 4, and a separation oxide film 1102 are successively produced on a predetermined region of the $p^-$ type silicon substrate 1. The productions of the respective regions are conducted by similar methods to those shown in FIGS. 10(A) to (B). Next, after removing the underlying oxide film 1101 and the nitride film 1201 shown in FIG. 10(B), a silicon film, preferably a polysilicon film 1600, an oxide film 1104, and a nitride film 1202 are produced successively on the surface of the semiconductor substrate 3 in this order. Herein, the oxide film 1104 may be produced by accumulating the same with the use of a CVD technique or by oxidating the surface of the polysilicon film 1600.

FIG. 1(B)

Next, the multi-layer film comprising the nitride film 1202 and the oxide film 1104 are etched by using the resist film having a predetermined pattern configuration as a mask. By this patterning, the portions of the oxide film 1104 and the nitride film 1202 at the regions, which later will become the collector electrode leading out layer and the emitter layer, are removed. Subsequently, a selective oxidation is conducted by using the nitride film 1202 as a mask, to produce an oxide film 1105 at a predetermined region on the semiconductor substrate surface. Herein, the selective oxide film 1105 is produced thick so that the polysilicon film 1600 completely changes to the oxide film, and boron ion injection is conducted into the polysilicon film 1600 by using this oxide film as a mask to produce a first $p^+$ type polysilicon film 1601. At the same time, by conducting diffusions from these layers a $p^+$ layer 51, which will become an external base layer, is produced.

FIG. 1(C)

Figure 1A:
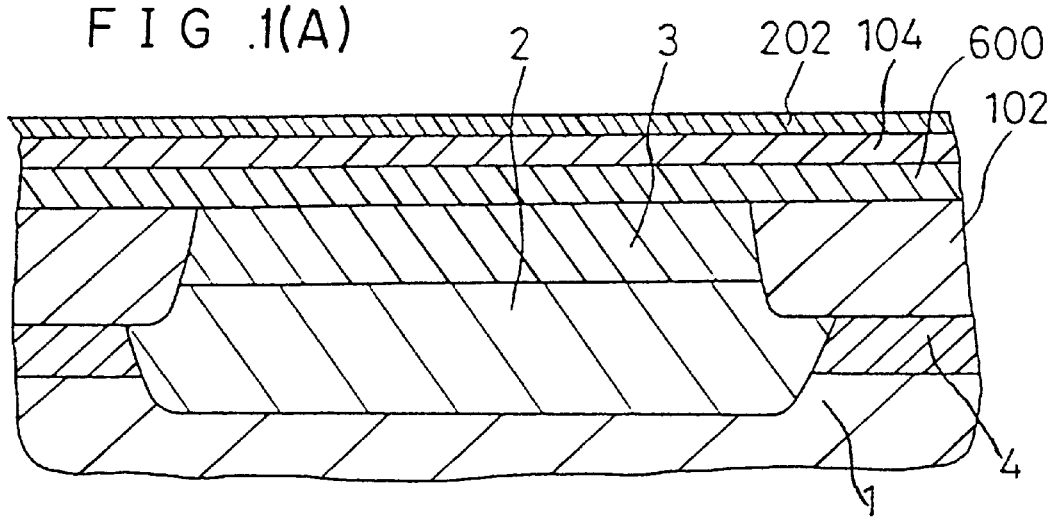
FIGS. 1(A) to 1(G) are diagrams showing cross-sectional structures at the major process steps of a method of producing a semiconductor integrated circuit device in a first embodiment of the present invention.
Figure 1B:
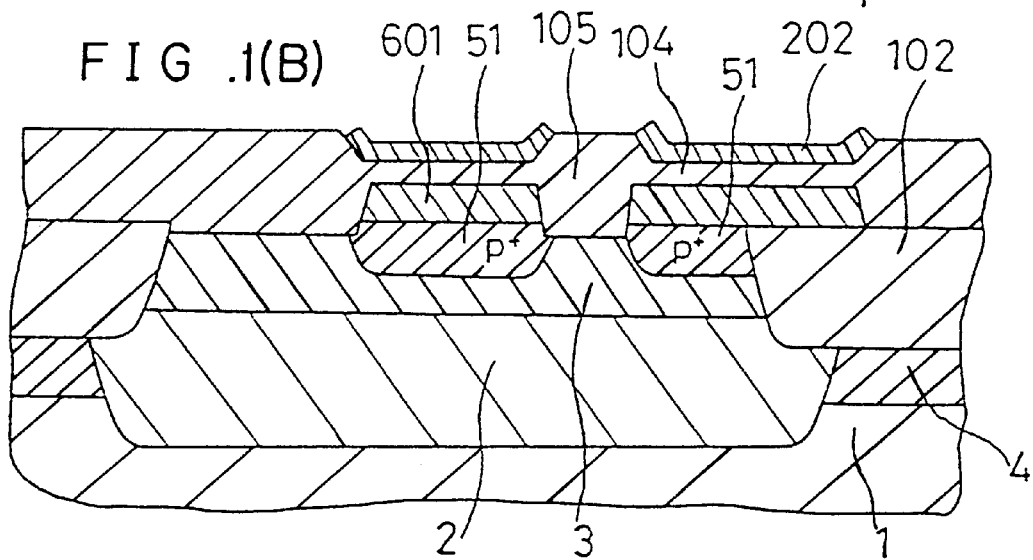
Figure 1C:
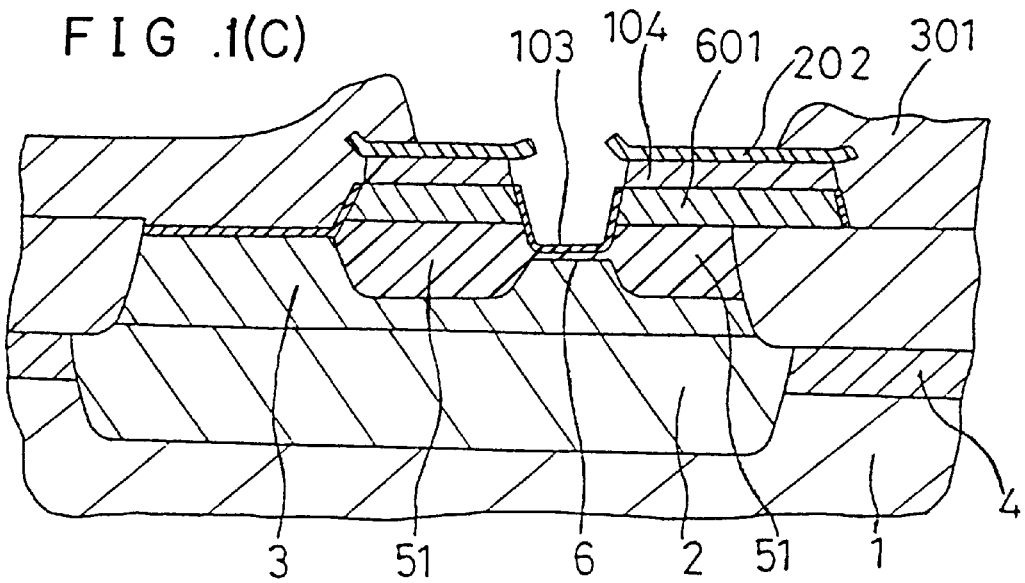
Figure 1D:
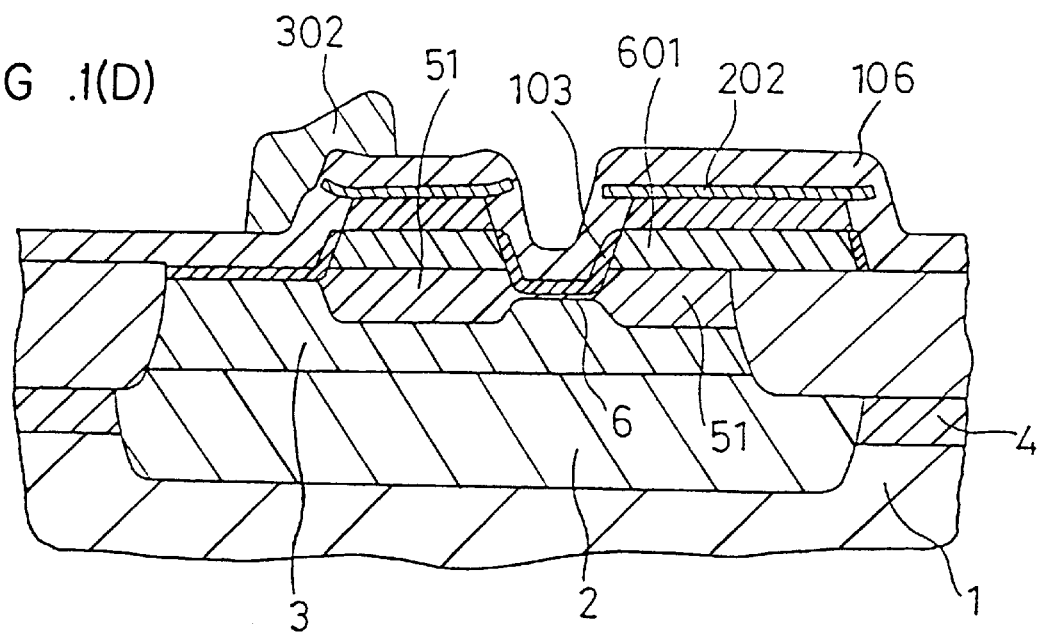
Figure 1E:
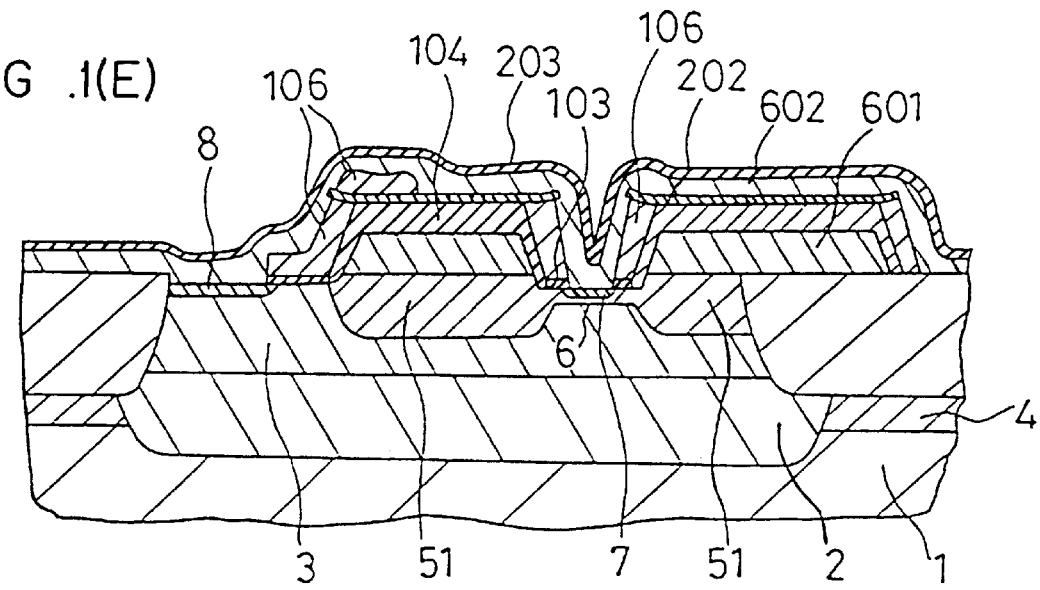
Figure 1F:
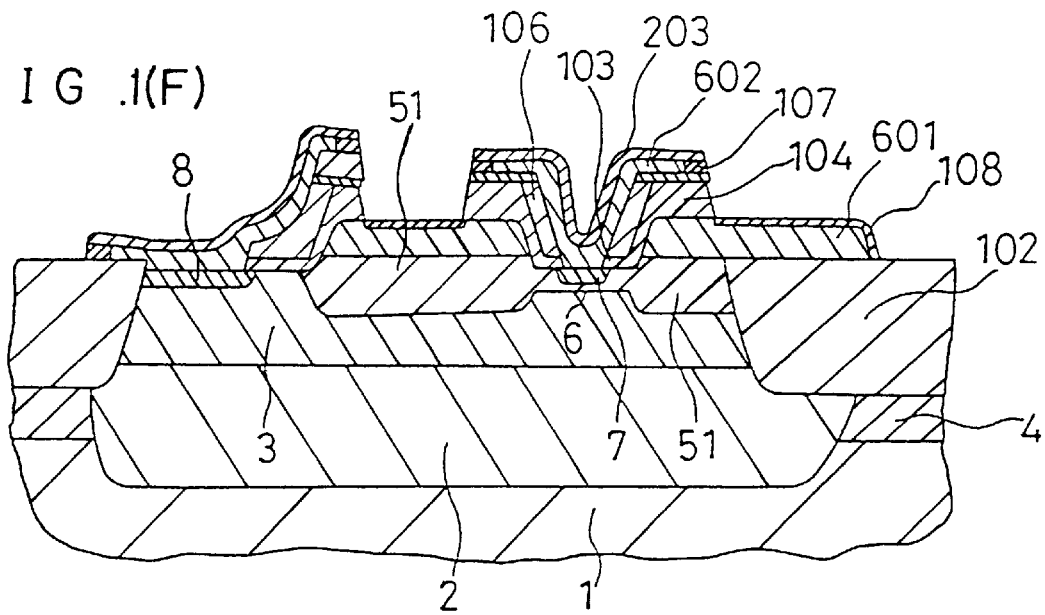

Next, after the oxide film 1105 is perfectly removed by using the nitride film 1202 as a mask, a $p^-$ type impurities injected layer 6, which will become an active base layer, is produced by using the resist film 1301 as a mask (FIG. 1(C)). Of course, a boron ion injection may be conducted through a thin oxide film 1103.

FIG. 1(D)

Next, an oxide film 1106 is deposited by a CVD method after the resist film 1301 is removed, and a resist film 1302 is selectively produced between the collector and the base, and the oxide films 1106 and 1103 are removed by an isotropic etching method (RIE) which uses the resist film as a mask. Then, the nitride film 1202 also functions as a mask so that the oxide film 1104 and the oxide film 1106 surely remains at the side wall of the polysilicon film 1601 below the nitride film 1202.

FIG. 1(E)

Next, after the resist film 1302 is removed, a second polysilicon film 1602 is produced, n+ type impurities are introduced thereto, and a nitride film 1203 is produced theron. In a case where an ion injection method is used, annealing is conducted to uniformly diffuse impurities into the polysilicon film 1602. Then, a small amount of impurities are diffused into the n− epitaxial layer from the polysilicon film 1602, and intermediate layers of the emitter layer 7 and the collector leading out layer 8 are produced.

FIG. 1(F)

Then, the nitride film 1203, the n+ polysilicon film 1602, the nitride film 1202, the oxide film 1104 other than the portion above the emitter 7 and the collector leading out portion 8 are successively removed by using the resist film as a mask. A low temperature oxidation (800 to 850° C.) is conducted while using the nitride film 1203 as a mask. The thick oxide film 1107 is produced at the side wall of the n+ polysilicon film 1602, and a thin oxide film 1108 is produced at the surface of the p+polysilicon film 601. This is conducted by utilizing the fact that the lower the oxidation temperature becomes in the n+ layer silicon-polysilicon film, the larger the acceleration oxidation effect becomes.

FIG. 1(G)

Next, silicide films 1502, 1503, and 1504 are produced by removing the nitride film 1203 by an entire surface wet (phosphoric acid) removal. A PSG film 1401 is deposited and annealed to be sintered. The emitter layer 71, the active base layer 61, the external base layer 52, and the collector leading out layer 81 are then produced. Thereafter, contacts are produced, and electrode wirings 9 and 11 are provided. Herein, the silicide films 1502 and 1504 are not provided for preventing the electrode extrusion as in the prior art device, the films are provided for obtaining a low resistance. When a high temperature (900 to 1000° C.) results by sintering the PSG film 1401, titanium silicide or tungsten silicide may be used. If there is no requirement for an anti-impurity diffusion, the PSG film may be of a double layer structure constituted by at least a non-doped CVD film. Furthermore, when a low temperature produced plasma oxide film or a nitride film, which requires no sintering, is used, Pt silicide or Pd silicide may be used.

The function and operation of the device will be described in the following paragraphs.

Figure 1G:
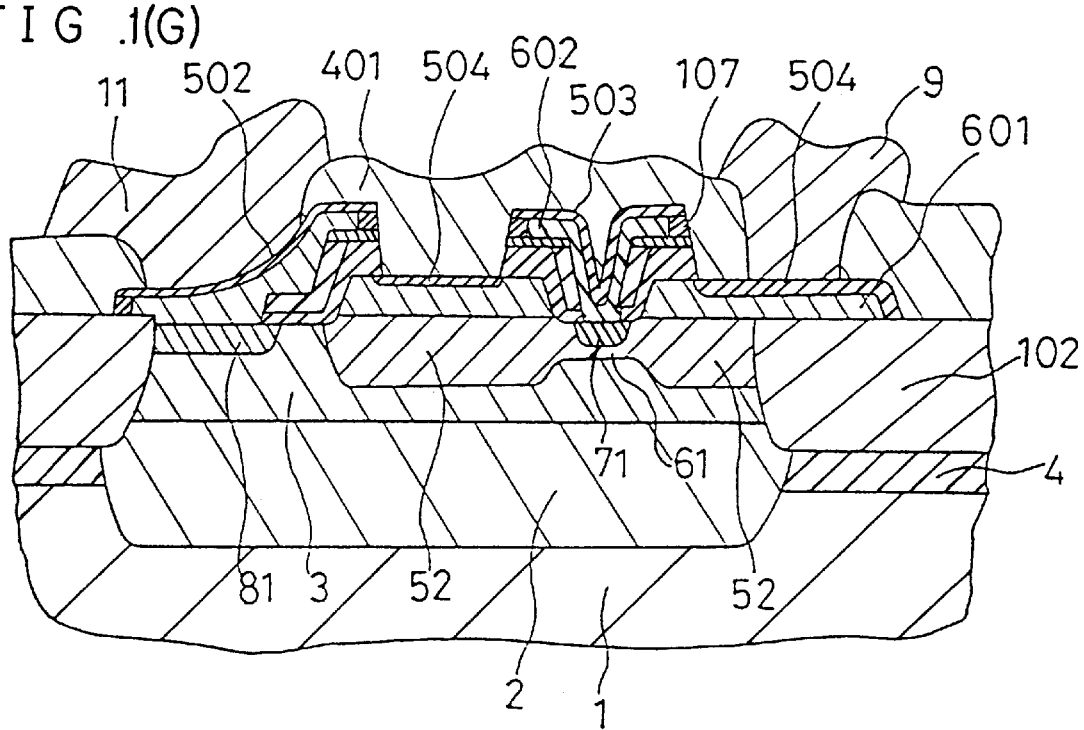
Figure 2:
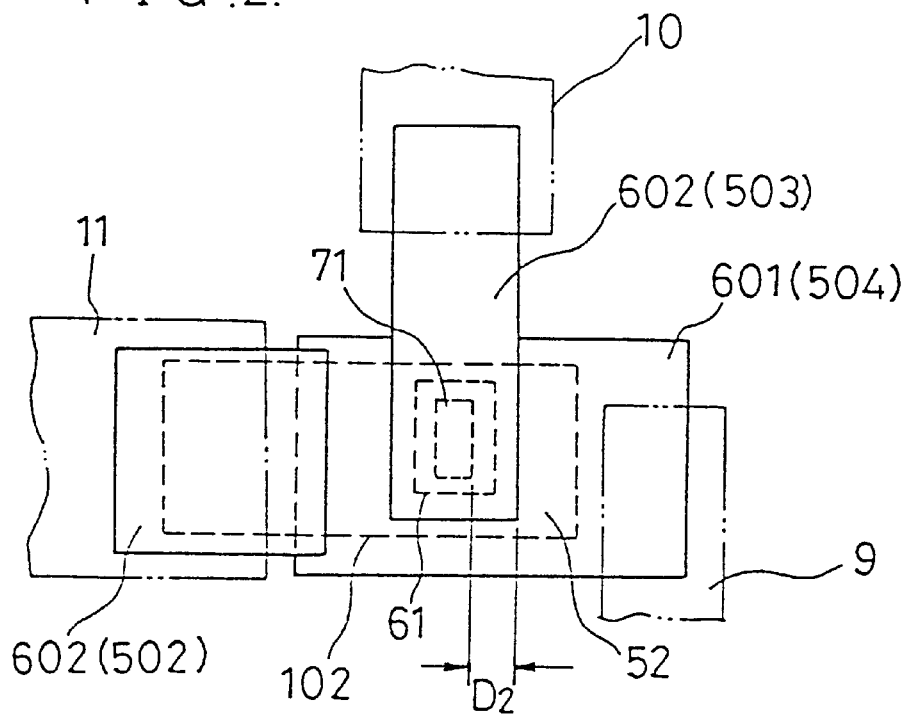
FIG. 2 is a diagram showing a plain pattern of the transistor produced by the first embodiment.

FIG. 2 shows a plain pattern of a transistor which is produced by a method in a first embodiment of the present invention. This corresponds to the plain pattern of a prior art transistor shown in FIG. 11. As shown in FIG. 2, the distance between the external base layer 52 and the emitter layer 71 is determined by self alignment, the base resistance is efficiently lowered, and the wiring resistance between the external base layer 5 and the base electrode 9 is also lowered to a great extent by the silicide film 1504 on the p+ polysilicon film 1601. Thus, as shown in FIG. 1(G), the base electrode contact is located above the oxide film 1102 for reducing the base capacitance to a great extent. Furthermore, the distance D2 between the emitter layer 71 and the low resistance base leading out layer 1504 has a value which only includes a portion of a value corresponding to the mask alignment preciseness (below 1 micron), and from this fact the base resistance is lowered to a great extent. Furthermore, because the emitter electrode 10 is not provided on the emitter layer 71 but on the oxide film by leading out the electrode by the silicide film 1503 and the n+ polysilicon film 1602, the degree of freedom in the condition for producing the periphery of the emitter layer is increased.

Accordingly, even if the emitter layer is of a small width or the n+ polysilicon film 1602 has a narrow width, the contacts may be produced with a loose photolithography preciseness.

Figure 12:
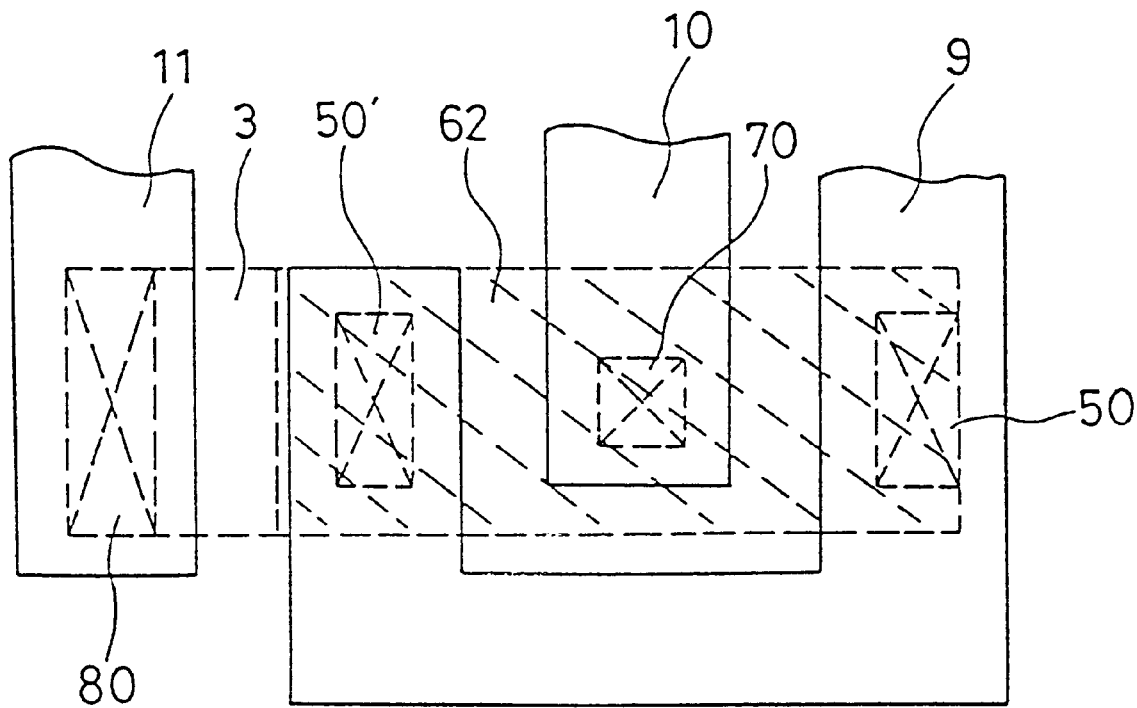
FIG. 12 is a diagram showing a plain pattern of a transistor for a double base structure produced through the prior art method.

Furthermore, in the prior art double base structure (FIG. 12), when the base resistance is attempted to be lowered, the base area increases. In the present embodiment the structure is automatically in a double base structure, and it is not necessary to produce a new base contact. Also, the increase of the base area is suppressed to a great extent to enhance the frequency characteristics of the semiconductor device.

Figure 3:
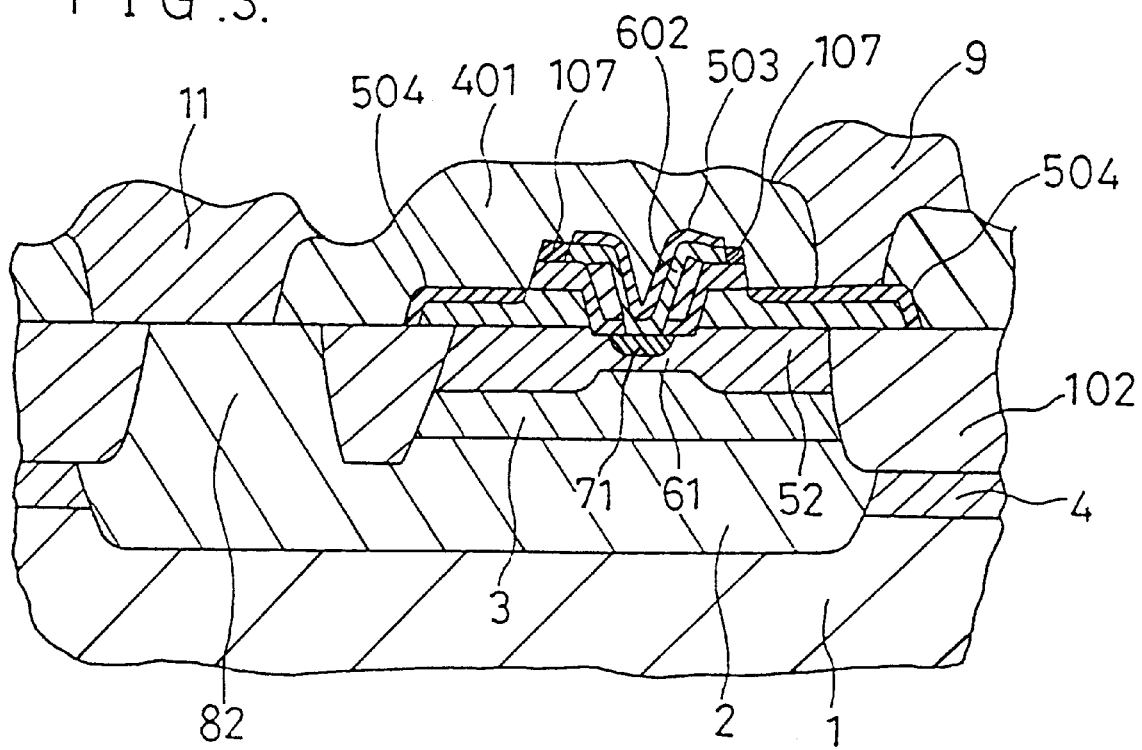
FIG. 3 is a diagram showing a cross-sectional structure for exemplifying a method of producing a semiconductor integrated circuit device as an alternative to the first embodiment of the present invention.

FIG. 3 shows an alternative to the first embodiment of the present invention. In this embodiment a thick oxide film 1303 is produced between the base collector, and the other portions are the same as those in FIG. 1(G). In this embodiment, in addition to the advantages of the above-described embodiment, it becomes unnecessary to provide the resist mask 1302 of FIG. 1(D), and it is possible to conduct an entire surface RIE.

As is evident from the foregoing description, according to the first embodiment of the present invention, a silicide film is produced on the silicon film which for connections between the base layer and the base electrode and between the emitter layer and the emitter electrode, whereby the wiring resistance between the external base layer and the base electrode is lowered to a great extent. Furthermore, the emitter electrode can be led out on a region other than the region directly above the emitter layer without increasing the wiring resistance.

According to another aspect of the first embodiment of the present invention, a base active layer is produced by self alignment, and an emitter layer is produced in the base active layer by self alignment, whereby only an insulating film is located between the silicon film on the emitter region and the metal electrode film on the base region, and the emitter base interval is effectively reduced. Furthermore, the emitter width can be reduced to the extent of the film thickness of the insulating film. As a result, a semiconductor device having a small base resistance and base collector capacitance, a small emitter width and a small emitter base capacitance can be produced having a good frequency characteristics.

A second embodiment of the present invention will be described with reference to FIG. 4.

FIGS. 4(A) to 4(H) show the cross-sectional views of the major process steps for a method of producing a semiconductor integrated circuit device in a second embodiment of the present invention. In FIGS. 4(A) to 4(I), the same reference numerals designate the same elements as those used in the description of the prior art device. The method of producing a semiconductor integrated circuit device of this second embodiment will be described in the following paragraphs.

FIG. 4(A)

Figure 13A:
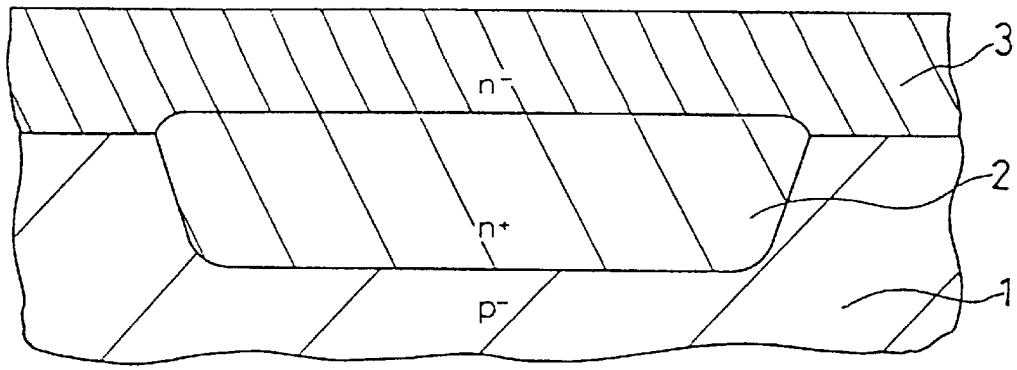
FIGS. 13(A) to (I) are diagrams showing cross-sectional structures of a semiconductor integrated circuit device at major process steps of a second prior art production method.
Figure 13B:
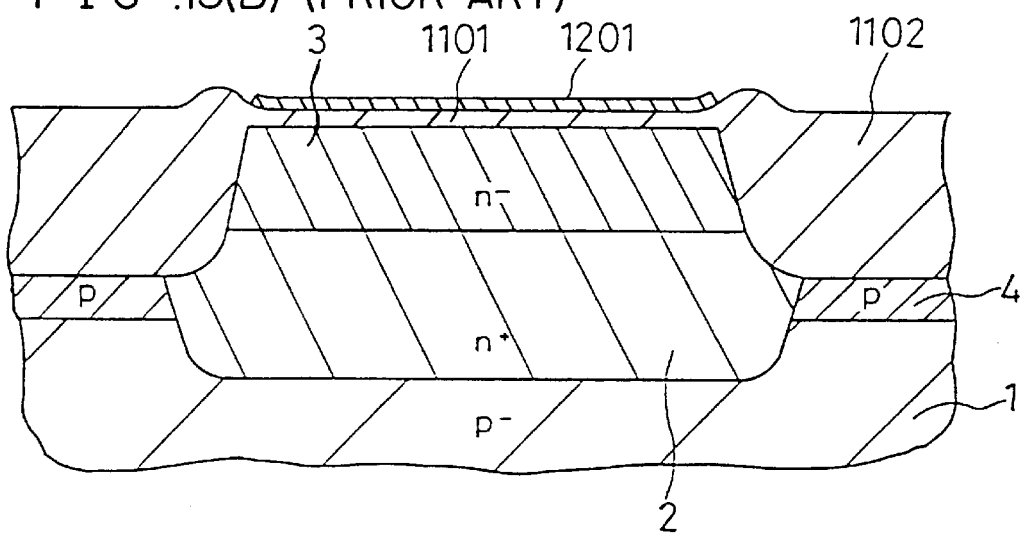
Figure 13C:
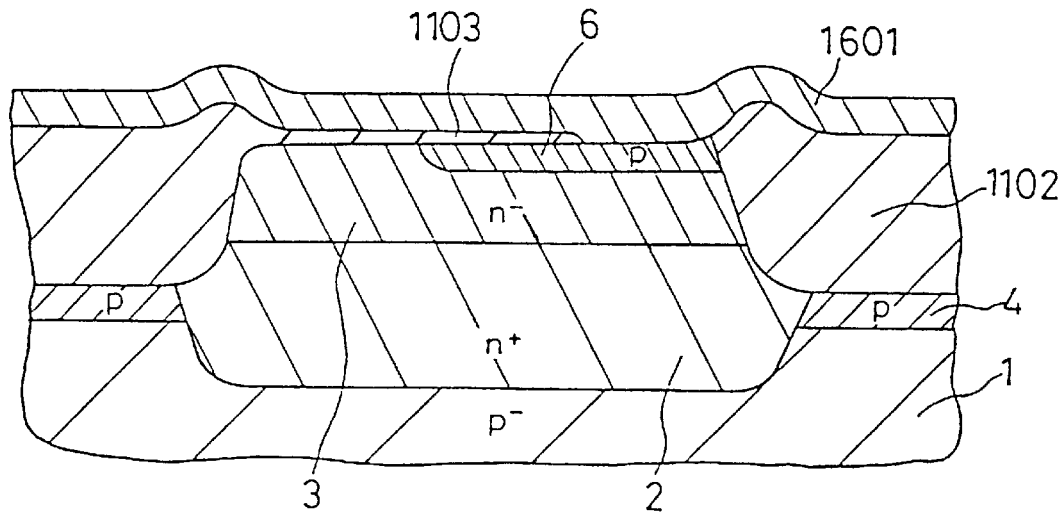
Figure 13D:
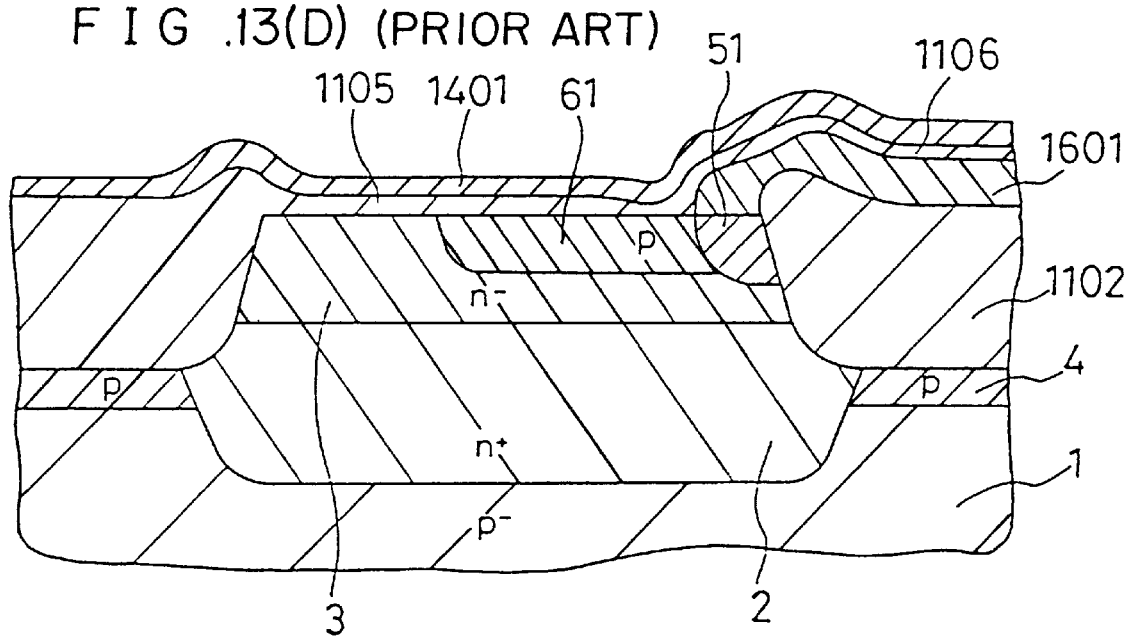
Figure 13E:
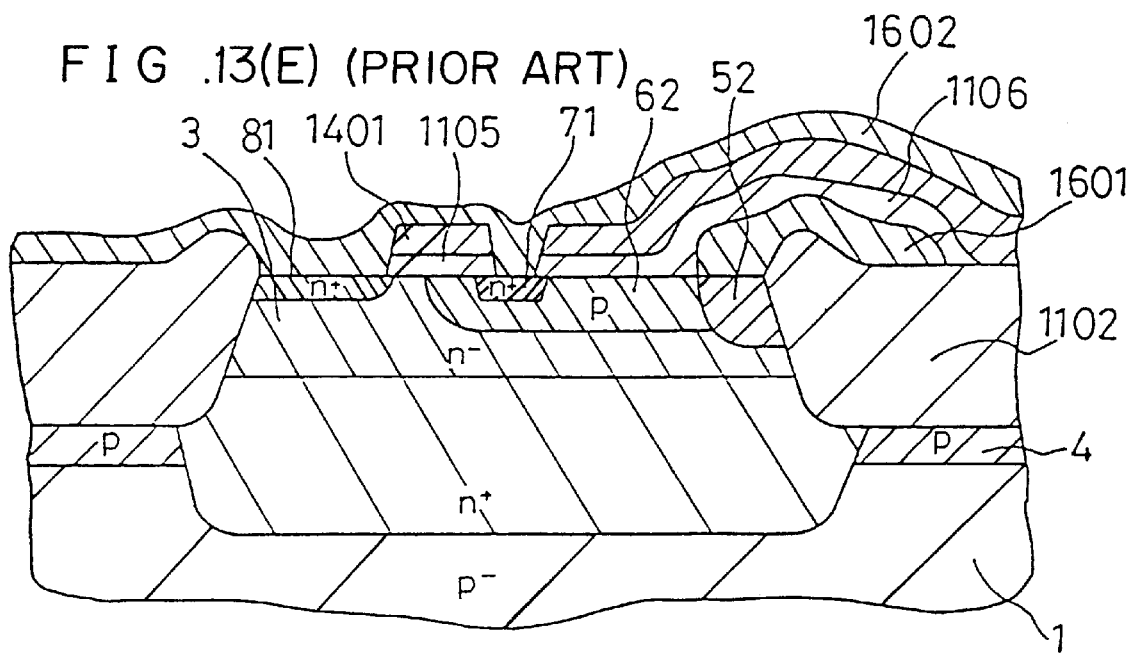
Figure 13F:
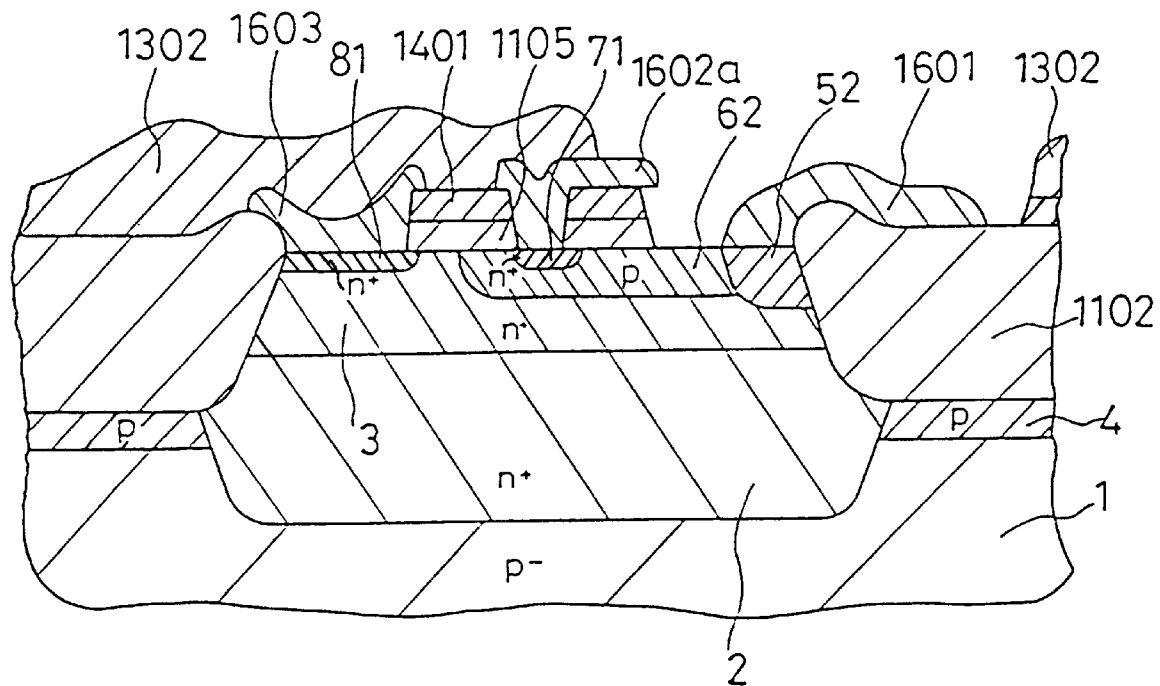
Figure 13G:
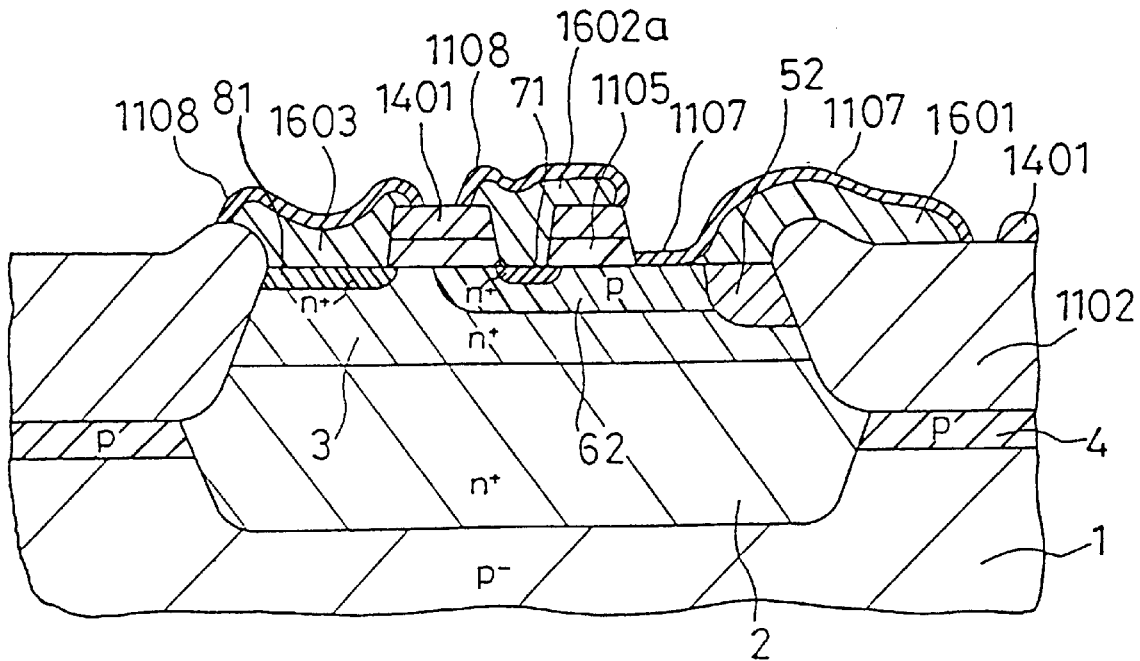
Figure 13H:
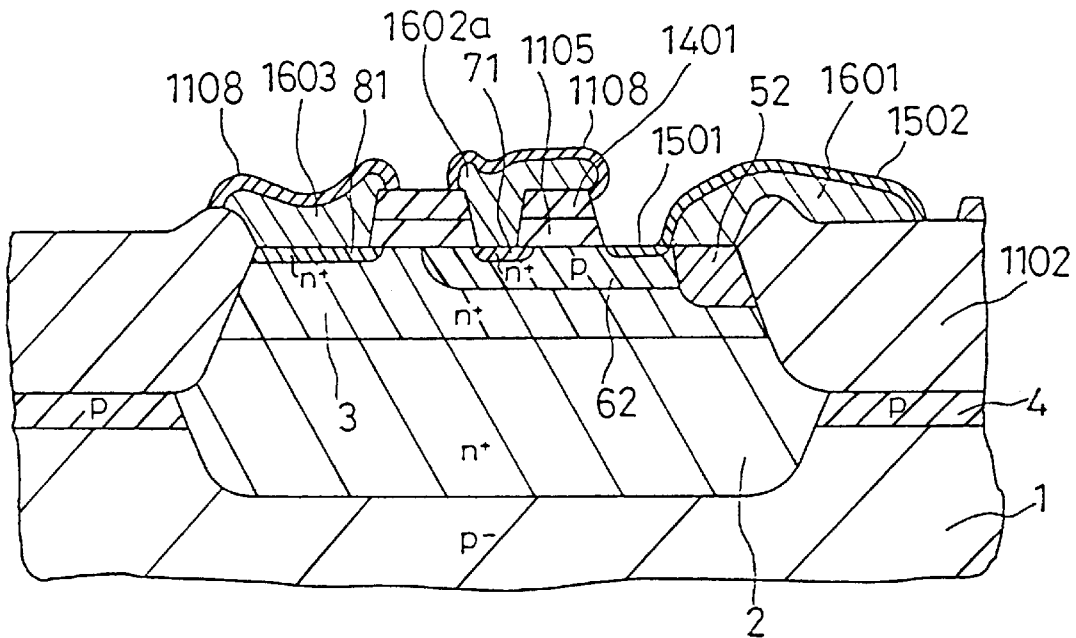
Figure 13I:
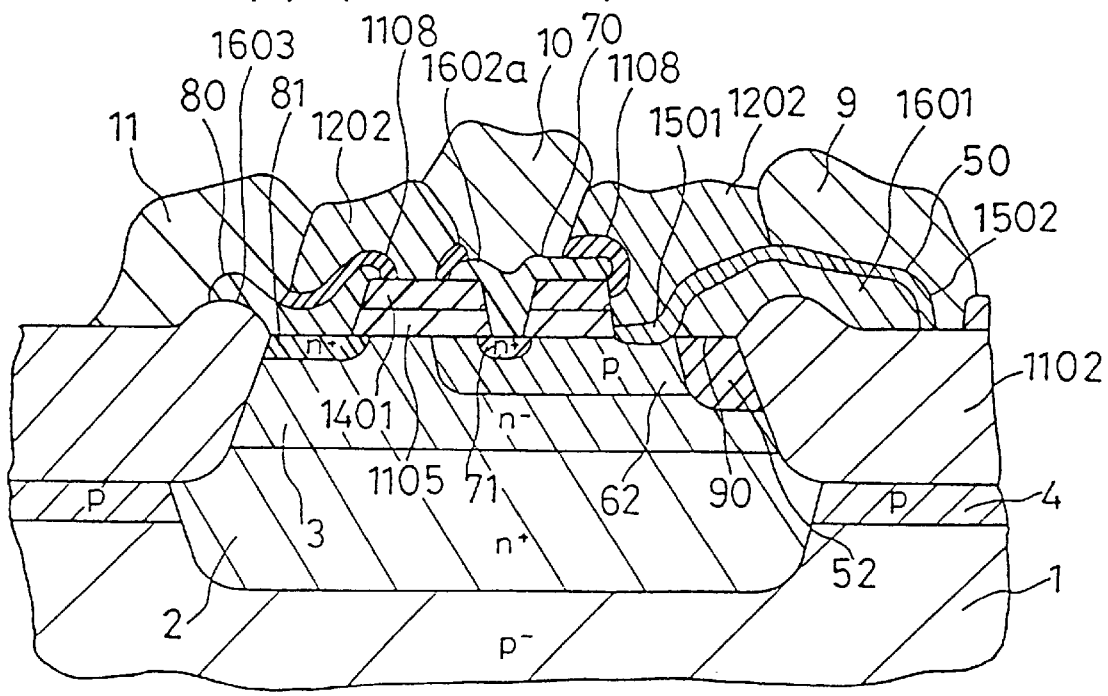

As in the prior art device, an n+ type collector embedded layer 2, an n− type epitaxial layer 3, a channel cutting p type layer 4, and a separation oxide film 1102 are produced on a p− type silicon substrate 1, and the nitride film 1201 and the underlying oxide film 1101 shown in FIG. 13(B) are removed. Next, after a silicon film 1600 is coated over the entire upper surface thereof, an oxide film 1110, a nitride film 1203, and an oxide film 1111 are successively coated over the surface in this order. Herein, the oxide film 1110 may be produced by oxidating the silicon film 1600. When the selective etching of the nitride film 1203 and the silicon film 1600 are conducted, the oxide films 1110 and 1111 are not required. However, a case where a general plasma etching method is used and an oxide film is required will be described as an example.

FIG. 4(B)

The compound films 1110, 1203, and 1111 including the nitride film 1203 are selectively removed by etching so that the compound films 1110, 1203, and 1111 remain on the regions which will become an external base region and a base electrode leading out region. Next, etching is conducted by using the resist film 1301 as a mask to remove the silicon film 1600 between the region which will become a collector electrode leading out region and the region which is to become an external base layer is removed. When etching the compound films 1110, 1203, and 1111, the silicon film 1600 is etched to a predetermined thickness, and the film thickness of the oxide film which is produced at the next process may be made thin. Furthermore, the surface of the n⁻ layer 3 may be etched a little when the silicon film 1600 is etched by using the resist film 1301 as a mask. Herein, the etching of the silicon film at the portion in contact with the region which will become an external base layer is conducted by using the compound films 1110, 1203, and 1111 as a mask. The resist film 1301 is provided to protect the portions from being etched where the compound films 1110, 1203, and 1111 are not produced which must not be etched (that is, at least the region which is to become an active base layer).

FIG. 4(C)

In conducting a selective oxidation by using the nitride film 1203 as a mask after the upper oxide film 1111 of the compound layer is removed (although it need not be necessarily removed at this step), it is better to remove the layer at this step in order to prevent the film reduction of the oxide film which is produced at the later process. The silicon film 1600 is changed to oxide films 1113 and 1114, and an oxide film 1112 is grown on the surface of the exposed n⁻ layer 3. By conducting a sintering process after introducing p type impurities into the silicon film under the nitride film 1203 by using the selective oxide films 1112, 1113, and 1114 as masks, p type impurities are diffused including the silicon film 1601, and the intermediate stage external base layer 51 is produced. Herein, the oxide film 1112 is produced by selectively oxidizing the epitaxial layer 3, and the advantages arise in that the step produced with the adjacent silicon film is quite small, and that the voltage resistivity of the transistor is enhanced due to the fact that the oxide film 1112 is produced deeply into the junction surface of the external base layer 51.

FIG. 4(D)

The oxide film 1114 and 1112 on the region which will become an active base layer and the region which will become a collector electrode leading out layer are removed with the use of a general photolithography and etching method. Also, the nitride film 1203 is removed, and thereafter the oxide film 1105 is produced. Next, the region which will become a collector electrode leading out region is coated over by a resist film (not shown), and after introducing p type impurities into the region which will become an active base layer, a passivation film 1401 is coated over and a sintering process is conducted. By this method, an intermediate stage active base layer 61 is produced. Herein, the etching removal of the oxide film on the region, which will become an active base layer, is self aligned by using the nitride film 1203 as a mask.

FIG. 4(E)

An aperture is produced by removing the passivation film 1401 and the oxide film 1105 on the region which will become an emitter layer and the region which will become a collector electrode leading out layer with the use of a general photolithography and etching method, and a second silicon film is coated thereon. After n type impurities are introduced to this second silicon film, the nitride film 1204 is coated thereon. A selective etching against this nitride film 1204 and an n type impurity including silicon films 1602 and 1603 is conducted, and the nitride film 1204 and the silicon films 1602 and 1603 remain so that the aperture portion is coated.

FIG. 4(F)

Subsequently, the passivation film 1401 and the oxide film 1105 are removed with the use of the selectively etched nitride film, and the silicon film 1601 is exposed at once. Thereafter, a low temperature oxidation process is executed thereto as in the prior art method, whereby a quick oxide film 1108 is produced at the side walls of the n type silicon films 1602 and 1603, and a thin oxide film 1107 is produced above the p type silicon film 1601. The nitride film 1204 is used as a mask at the previous process in order to reduce the wiring resistances of the n type silicon films 1602 and 1603 against the emitter electrode metal wiring by producing a metal silicide film on the n type silicon films 602 and 603. If an emitter electrode metal wiring is produced directly on the emitter layer as in a prior art device, the same production process as the process of the prior art method may be used in which the nitride film is not produced.

FIG. 4(G)

After the nitride film 1204 is removed and only the oxide film 1107 is washed out, the metal silicide films 1502, 1503, and 1504, which are the same films as those of the prior art device, are produced on the silicon films 1601, 1602, and 1603, respectively.

FIG. 4(H)

Figure 4A:
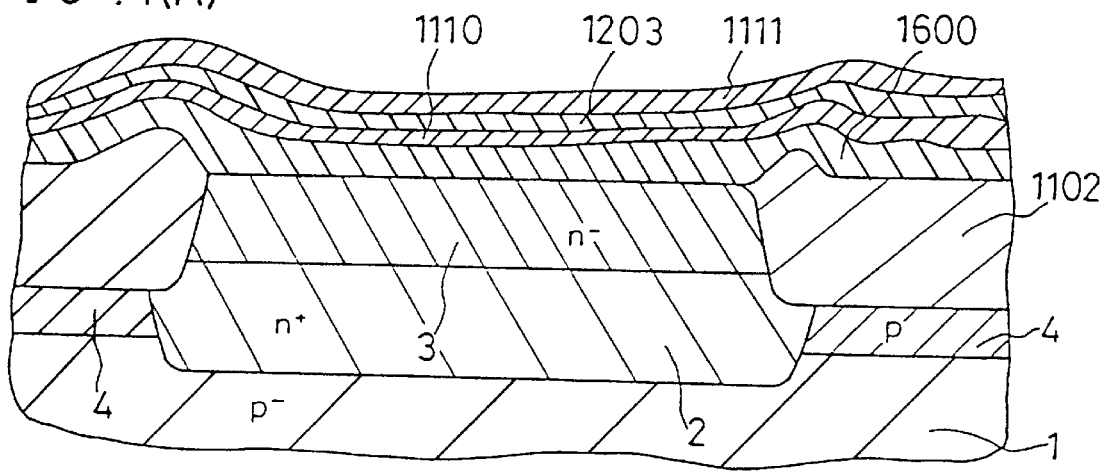
FIGS. 4(A) to 4(H) are diagrams showing cross-sectional structures at the processes in a method of producing a semiconductor integrated circuit device in a second embodiment of the present invention.
Figure 4B:
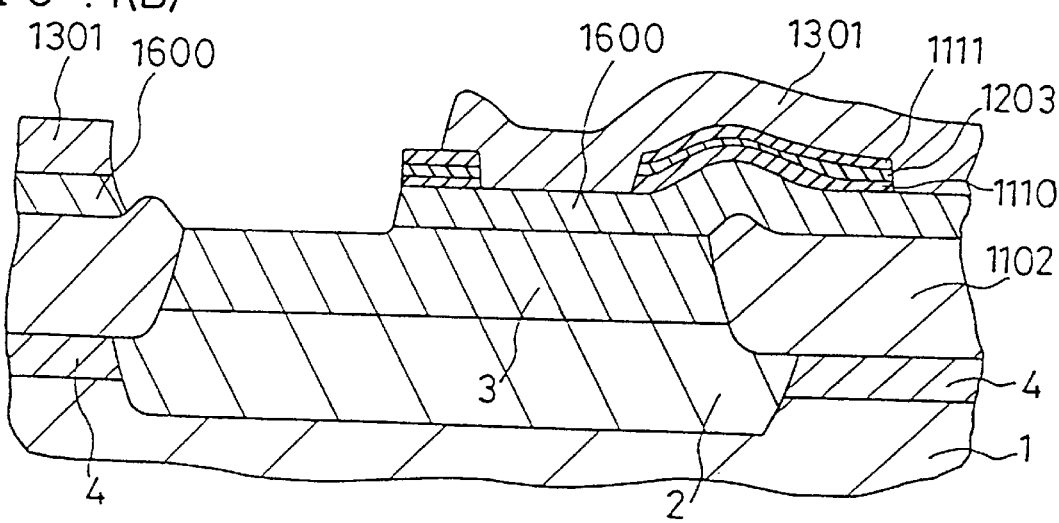
Figure 4C:
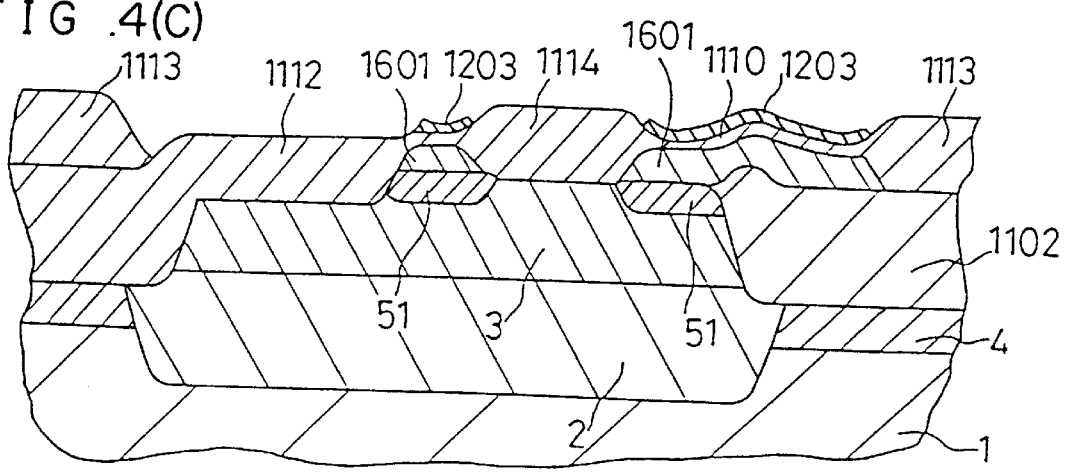
Figure 4D:
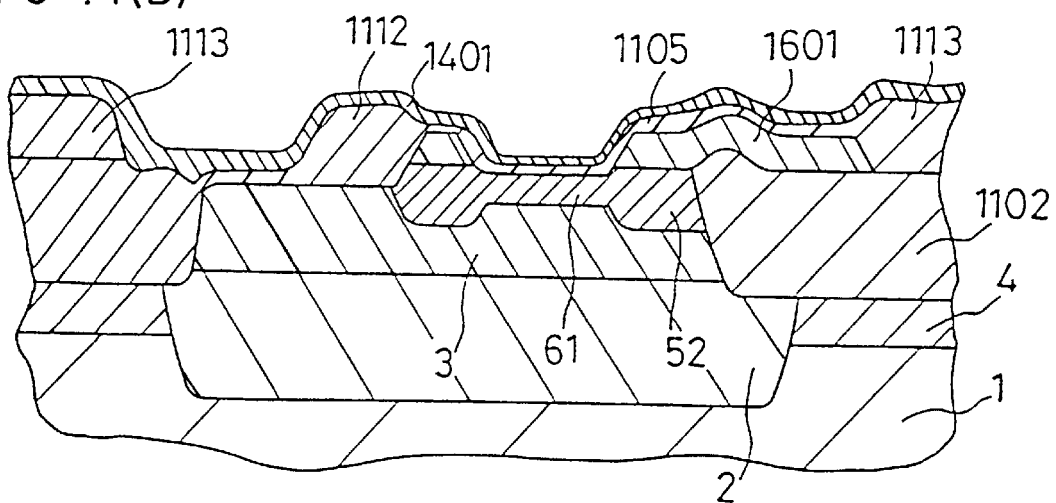
Figure 4E:
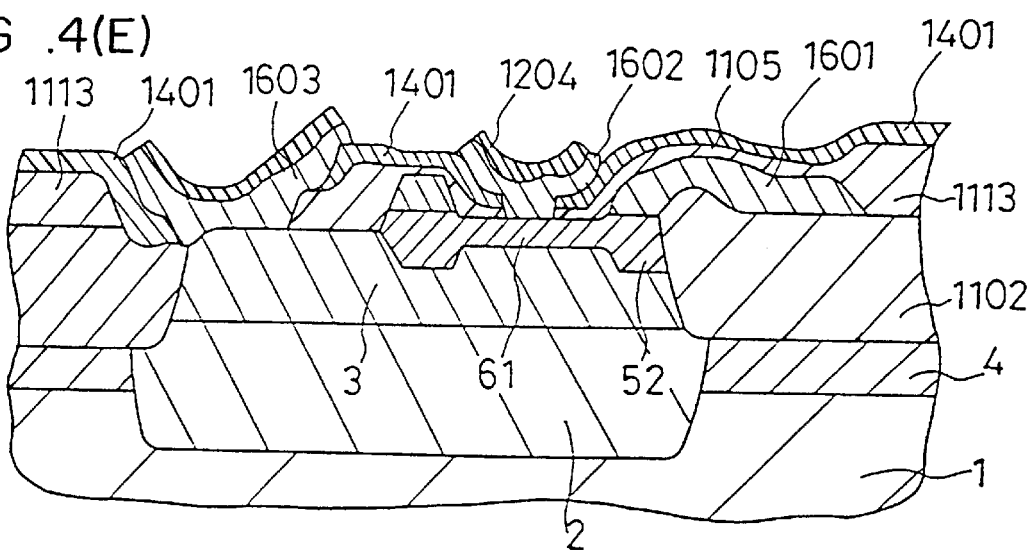
Figure 4F:
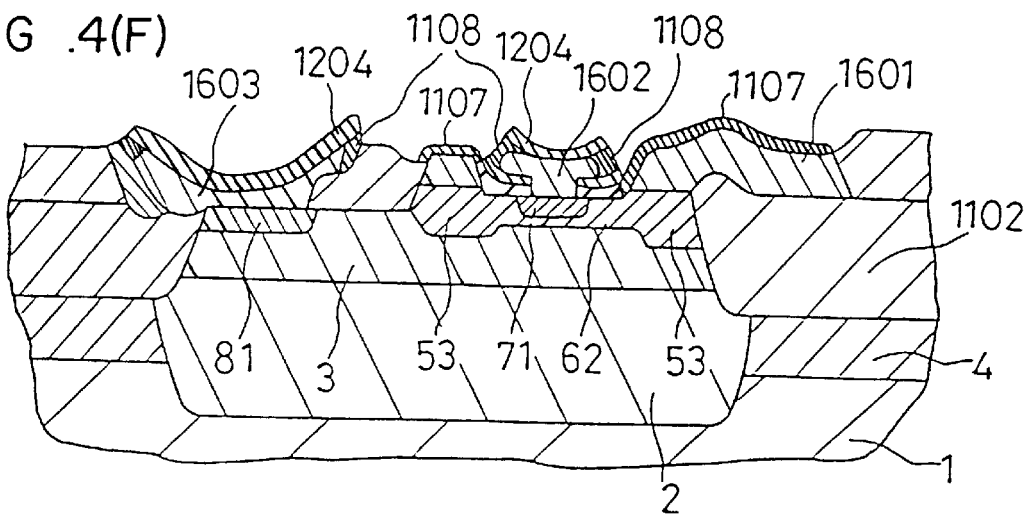
Figure 4G:
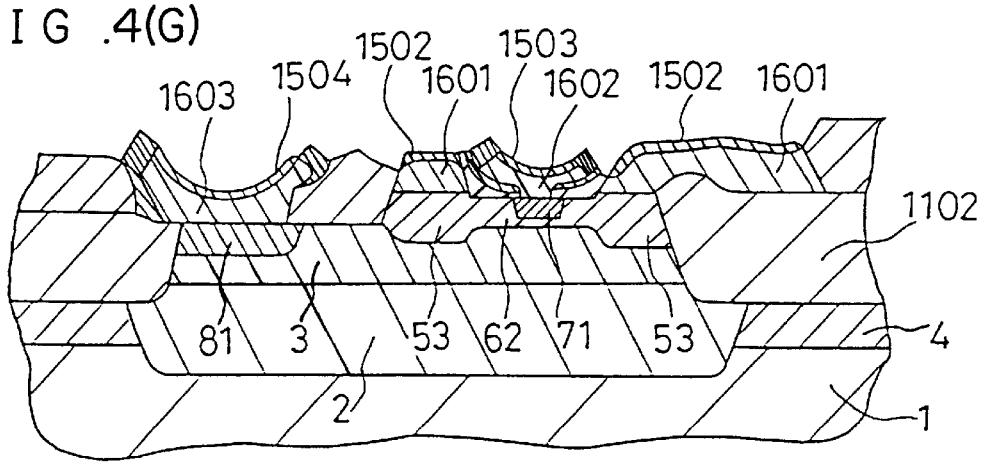
Figure 4H:
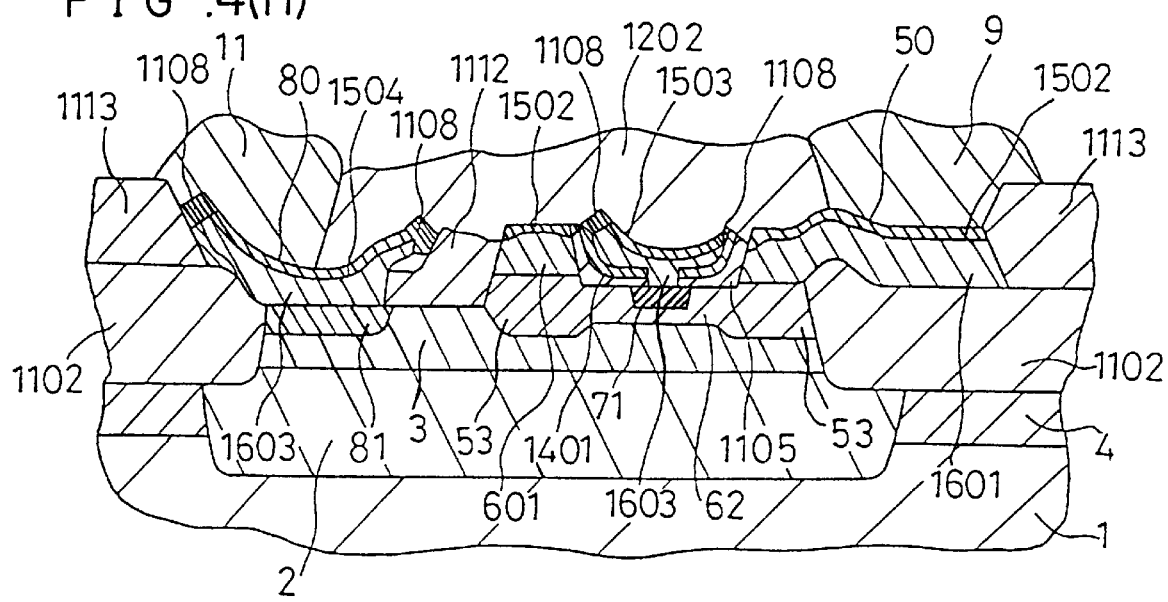

After the passivation nitride film 1202 (it may be an oxide film) is coated over, a selective etching is executed to the nitride film 1202, and a base electrode contact hole 50, an emitter electrode contact hole 70 (not shown in FIG. 4(H)), and a collector electrode contact hole 80 are apertured. Thereafter the base electrode metal wiring 9, the emitter electrode wiring 10 (now shown in FIG. 4(H)), and the collector electrode wiring 11 are respectively produced by using a low resistivity metal such as aluminum.

Figure 5:
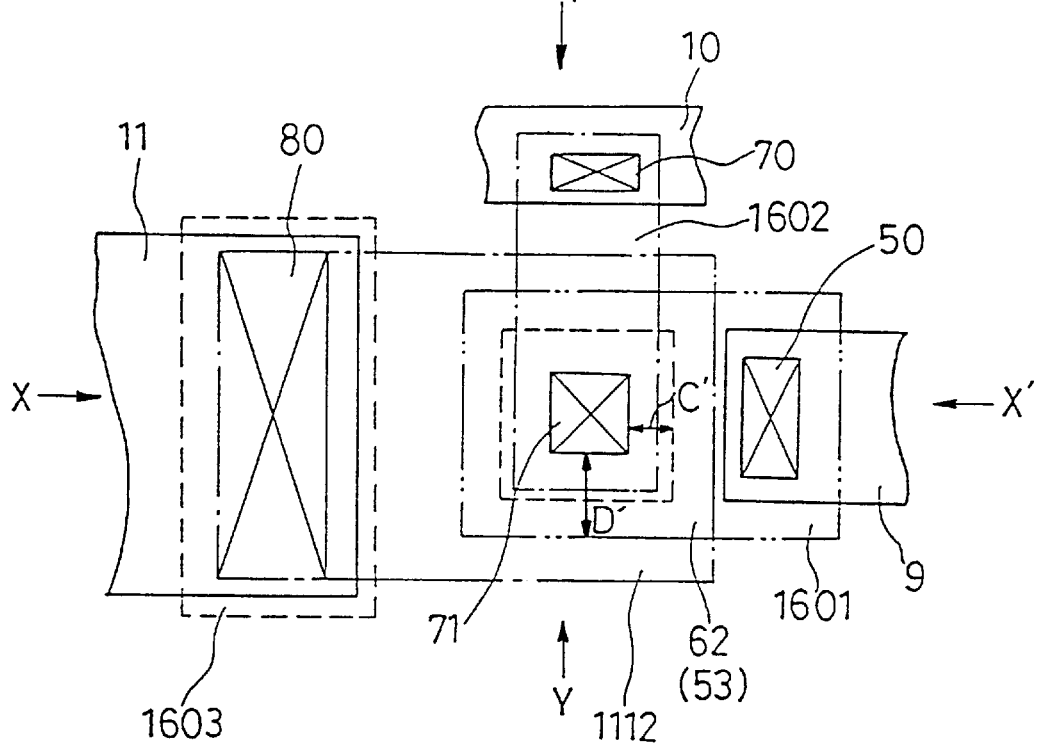
FIG. 5 is a diagram showing a plain pattern of a transistor produced through the above-described method of the second embodiment.
Figure 14:
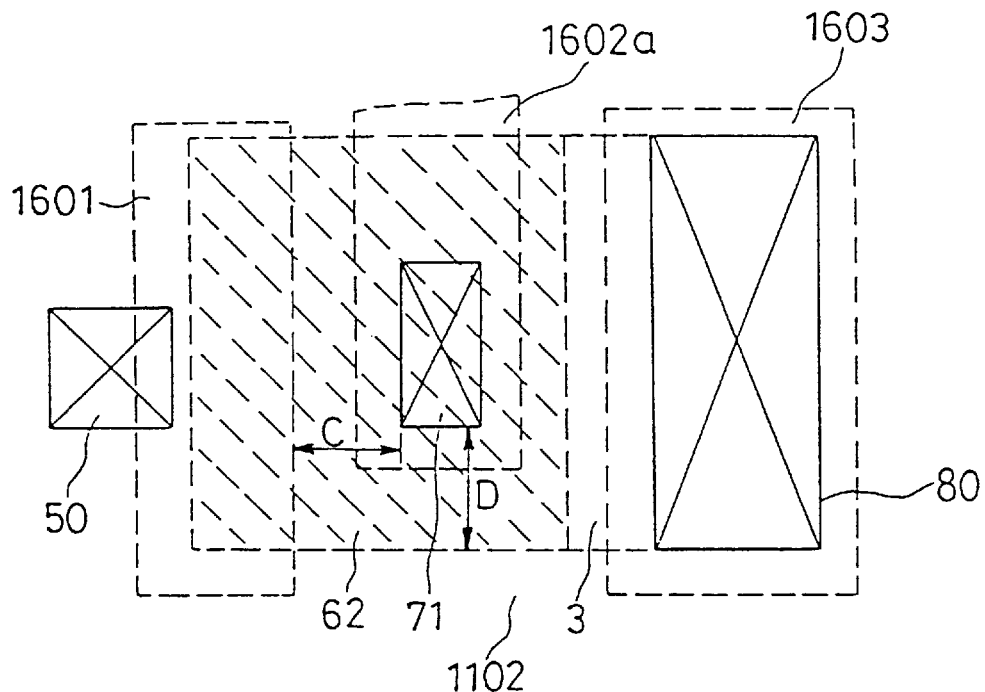
FIG. 14 is a diagram showing a plain pattern of a transistor which is produced through the second prior art method.
Figure 16:
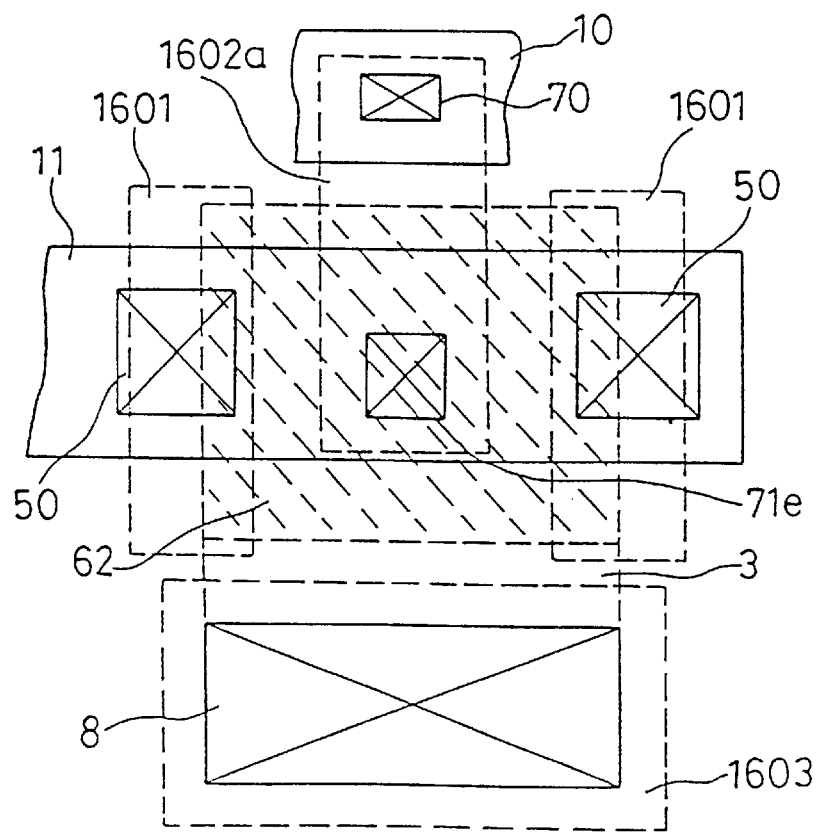
FIG. 16 is a diagram showing a plain pattern of a transistor of the prior art double base structure.

FIG. 5 is a diagram showing a plain pattern of a transistor for a semiconductor integrated circuit device produced through the above-described production processes, and corresponds to FIGS. 14 and 16 which show plain arrangements of transistors produced by the prior art method. The cross-sectional structure taken along the X–X' line of FIG. 5 is shown in FIG. 4(H). The photolithography for providing an aperture in the emitter layer 71 is conducted when it is overlapped with the silicon film pattern 1601, and the distance C' between the emitter layer 71 and the silicon film 1601 may be approximately equal to the overlappinig margin, that is, about half of the corresponding distance in the prior art device, whereby the base area can be reduced to a great extent.

Figure 6:
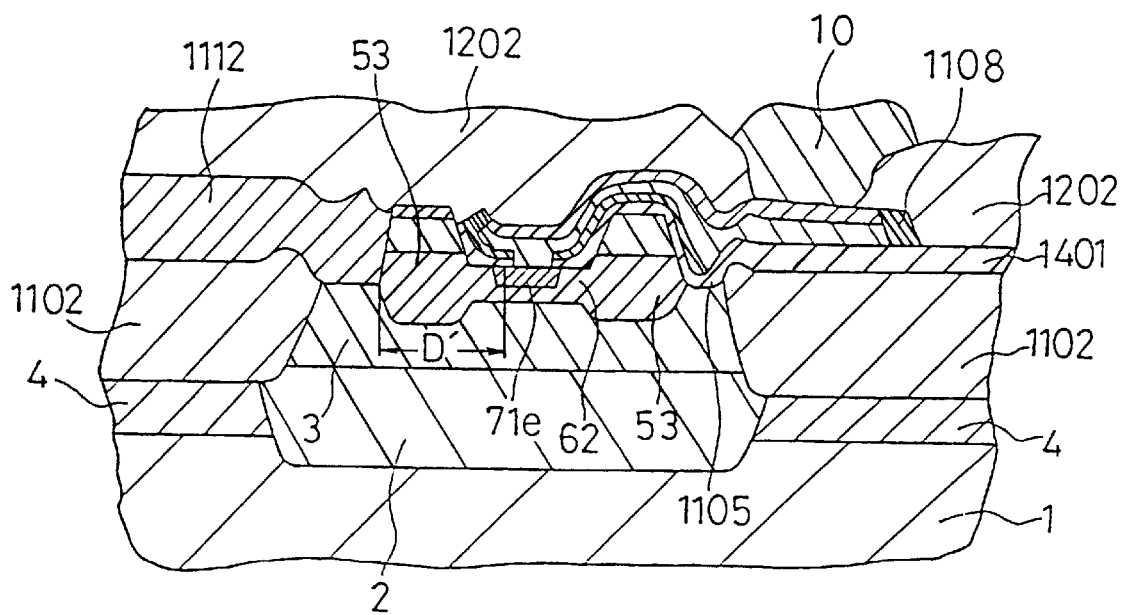
FIG. 6 is a diagram showing the cross-sectional structure taken along the lines Y–Y' of FIG. 5.

FIG. 6 shows a cross-sectional structure taken along the line Y–Y' in FIG. 5. Herein, as the distance D' varies between the emitter layer 71 and the walled portion (thick oxide film 1112), it is possible to obtain a constant value within one time of the photolithography overlapping margin because the thick oxide film 1112 is self-aligned from the patterning of the silicon film 1600 in a different manner from the prior art device.

Furthermore, the external base region 53 may not be produced in an extremely unbalanced state at the periphery of the emitter layer 71 which is seen in the prior art double base structure shown in FIG. 17. Rather, the base is produced at a position of a predetermined distance from the emitter layer 71. Thus, in the transistor element of the present invention the reduction of the base area to a great extent is enabled as well as the uniformity of parameters so that the base-collector capacitance and the base resistance are improved as is apparent from the comparison of FIGS. 6 and 17.

In the above-illustrated second embodiment, the silicon films which are connected to the external base layer 553, the emitter layer 71, and the collector electrode leading out layer 81 may be any monocrystalline silicon film, polycrystalline silicon film, or amorphous silicon films. Furthermore in the above-illustrated second embodiment, an element separation region comprising a thick oxide film is produced to separate the adjacent transistor layers. However, the present invention is not limited to such a case but may be applied, for example, to a case where a transistor having a separation region with the use of a trench (groove) structure to obtain the same effects as described above.

As is evident from the foregoing description, according to the second embodiment of the present invention, an external base region is produced by an impurity diffusion from a silicon film which has remained through the selective oxidation process. The selective oxide film region surrounded by the silicon film determines an active base region, and the selective oxide film obtained by selectively oxidating the silicon substrate at the periphery of the silicon film determines a field portion against the transistor. Accordingly, the photolithography for providing an aperture for the production of the emitter layer may be conducted when aligned with this silicon film pattern. Thereby, a reduction of the photolithography overlapping margin results which is included in the distance between the emitter layer and the silicon film connected to the base electrode and the distance between the emitter layer and the field end portion. This leads to a reduction in a base area, and also results in a reduction in the base-collector capacitance the base resistance. All of these reductions provide a semiconductor integrated circuit device for a transistor having good frequency characteristics.

A third embodiment of the present invention will be described with reference to FIG. 7.

FIG. 7(A) to FIG. 7(I) show the cross-sectional views at the major process steps of a method for producing a semiconductor integrated circuit device in a third embodiment of the present invention. In FIGS. 7(A) to 7(I), the same reference numerals designate the same elements as those in the description of the prior art device. The method for producing a semiconductor integrated circuit device of this fourth embodiment will be described in the following paragraphs.

FIG. 7(A)

As in the conventional device, an $n^+$ type collector embedded layer 2, an $n^-$ type epitaxial layer 3, a channel cutting p type layer 4, and a separation oxide film 2102 are produced on a $p^-$ type silicon substrate 1, and the nitride film 2201 and the underlying oxide film 2101 as shown in FIG. 4(B) are removed. Next, after a silicon film 2600 is coated over the entire upper surface thereof, an oxide film 2110, a nitride film 2203, and an oxide film 2111 are successively coated over the surface in this order. Herein, the oxide film 2110 may be produced by oxidizing the silicon film 2600. Furthermore, when the selective etching of the nitride film 2203 and the polysilicon film 2600 are conducted, the oxide films 2110 and 2111 are not required. However, a case where an oxide film is required while using a general plasma etching method will be described as an example.

FIG. 7(B)

The compound films 2110, 2203, and 2111 are selectively removed by etching so that the compound films 2110, 2203, and 2111 including the nitride film 2203 remain on the region which is to be an external base region and the region which will be a base electrode leading out region. Next, an etching is conducted by using the resist film 2301 as a mask, and the polysilicon film 2600 at the region which will become a collector electrode leading out region and between the region which will be a collector electrode leading out region and the region which will become an external base layer is removed. When etching the compound films 2110, 2203, and 2111, the polysilicon film 2600 is etched to a predetermined thickness, and the film thickness of the oxide film which is produced at the next process may be made thin. Furthermore, when the polysilicon film 2600 is etched by using the resist film 2301 as a mask, the surface of the $n^-$ layer 3 may be etched a little. Herein, the etching of the polysilicon film at the portions in contact with the region which will become an external base layer is conducted by using the compound films 2110, 2203, and 2111 as a mask, and the resist film 2301 is provided so as to protect the portions where the compound films 2110, 2203, and 2111 are not produced which must not be etched (that is, at least the region which is to become an active base layer)

FIG. 7(C)

After the oxide film 2111, which is the upper layer of on the compound layer, is removed (although it need not be necessarily removed at this step, this layer is better to be removed at this step in order to prevent the film reduction of the oxide film which is produced at the later processes), and the selective oxidation is conducted by using the nitride film 2203 as a mask. The silicon film 2600 is changed to oxide films 2113 and 2114, and an oxide film 2112 is grown on the surface of the exposed $n^-$ layer 3.

By conducting a sintering process after introducing p type impurities into the polysilicon film under the nitride film 2203 by using the selective oxide films 2112, 2113, and 2114 as masks, the diffusion of p type impurities is conducted from the p type impurities including silicon film 2601 to produce an intermediate stage external base layer 51. Herein, the oxide film 2112 is produced by selectively oxidizing the epitaxial layer 3. Therefore, advantages arise in that the step with the adjacent polysilicon film is quite small, and the enhancement of the voltage resistivity of the transistor is obtained due to the fact that the oxide film 2112 is produced deeply in the junction surface of the external base layer 51.

FIG. 7(D)

A diffusion window aperturing is selectively executed in the oxide film 2112. Diffusion of n type impurities is conducted to a high concentration, for producing a collector leading out layer 81.

FIG. 7(E)

The surface of the collector electrode leading out layer 81 is oxidized to produce an oxide film 2115, and the oxide film 2114 on the region which will become an active base layer is etched by using the nitride film 2203 as a mask. Then the oxide films 2112, 2113, and 2115 are coated over by the resist film 2302 to prevent these films from being etched, and an oxide film etching is conducted.

FIG. 7(F)

After the resistor film 2302 is removed, the oxide film is produced as a protection mask at the ion injection, and p type impurities are injected thereinto to coat over an oxide film 2117 on the entire surface, and an annealing is conducted to produce an intermediate stage active base layer 61. Herein, an ion injection technique is used for the introduction of p type impurities, but the thermal diffusion and the diffusion by a doped film can be also used. The active base layer 61 is self-aligned with the external base layer by using the nitride film 2203, the oxide film 2110, and the oxide film 2112 and 2115 as masks.

FIG. 7(G)

Figure 7A:
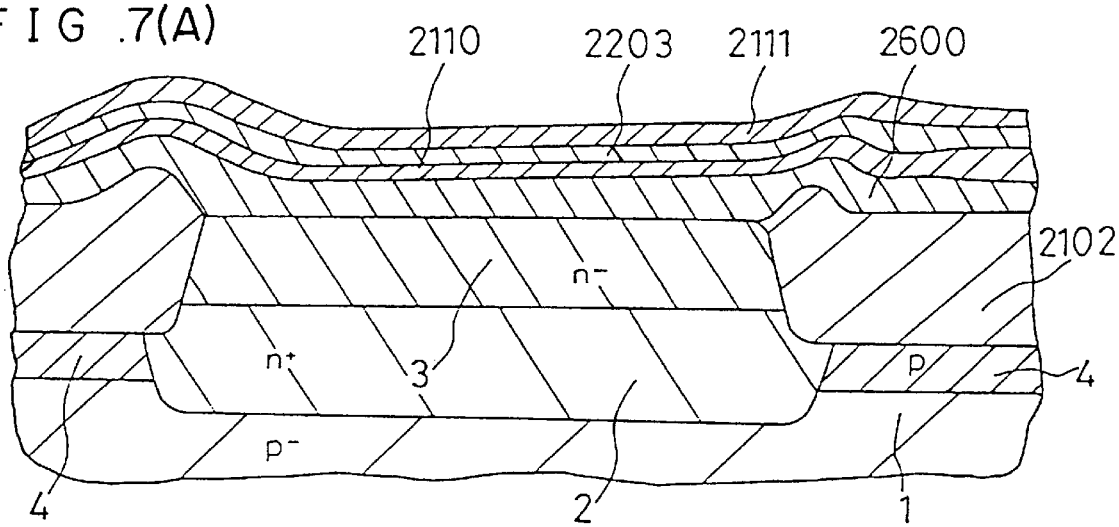
Figure 7B:
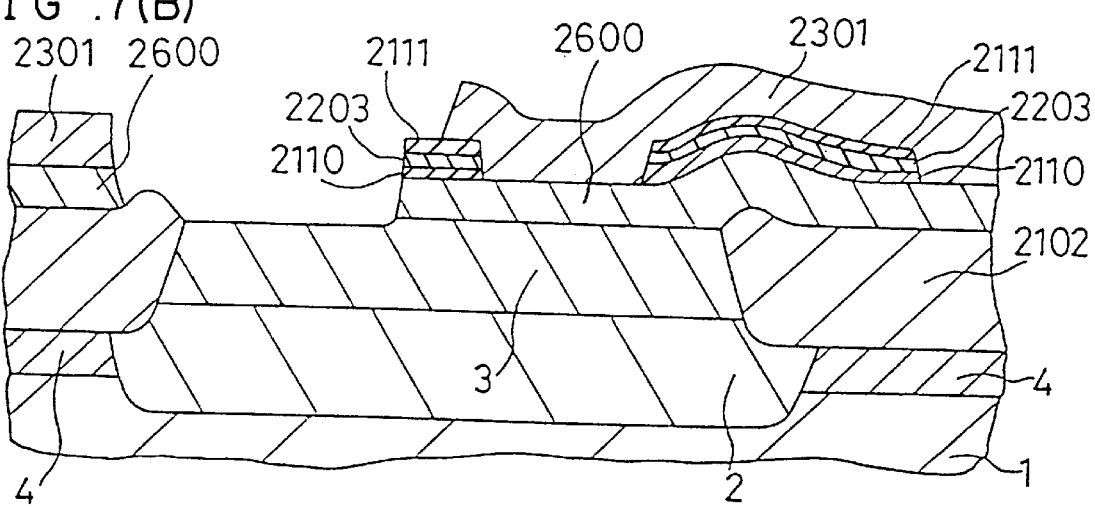

The oxide films 2117 and 2116 are removed with the use of an isotropic ion etching method (RIE). Then, the nitride film 2203 becomes a mask, and the oxide film 2110 under the nitride film 2203 and the oxide films 2116 and 2117 surely remain at the side wall of the polysilicon film 2601. Furthermore, after the nitride film 2203 is entirely removed, the second polysilicon film 2602 is produced thereby to introduce $n^+$ type impurities, and a nitride film 2204 is produced thereon. When the ion injection method is used, an annealing process is conducted to diffuse the impurities into the polysilicon film 2602 uniformly. Then, the impurities are diffused into the $n^-$ type epitaxial layer 3 to a small amount from the polysilicon film 2602 to produce an intermediate layer of an emitter layer 71. Then, the nitride film 2204 and the $n^+$ polysilicon film 2602 other than the emitter layer 71 are successively removed by a resist film mask (not shown). Then, the emitter layer 71 is self-aligned with respect to the polysilicon film 2601 which is a diffusion source of an external base, and the emitter layer 71 is produced at a predetermined distance from the external base layer 53 by the thickness length of the oxide films 2116 and 2117 at the side wall of the polysilicon film 2601. That is, the regions of the external base layer 53, the active base layer 61, and the emitter layer 71 are all determined by photolithography which is patterned on the nitride film 2203 as shown in FIGS. 7(A) to (B).

FIG. 7(H)

Subsequently to FIG. 7(G), the oxide film 2110 is removed by etching with the use of the resist film which is used for the patterning of the polysilicon film 2602. Thereafter, the resist film is removed, and a low temperature oxidation (800 to 850° C.) is conducted by using the nitride film 2204 as a mask. A thick oxide film 2119 is produced at the side wall of the $n^+$ polysilicon film 2602, and a thin oxide film 2118 is produced at the surface of the $p^+$ polysilicon film 2601. This utilizes the fact that the lower the temperature of the low temperature oxidation of the $n^+$ layer silicon-polysilicon film becomes, the larger the acceleration speed oxidation effect becomes.

FIG. 7(I)

The thin oxide film 2118 is removed by using the nitride film 2204 as a mask, and the nitride film 2204 is removed by an entire surface wet (phosphoric acid) removal to produce silicide films 2502 and 2503. Thereafter, the PSG film 2401 is deposited and annealed to conduct a sintering process, contact holes are produced, and electrode wirings 9 and 11 are provided. Herein, the silicide films 2502 and 2503 are not provided for preventing the extrusion of electrodes in the prior art device, but the films are provided for obtaining a low resistance. When the films are made at a high temperature (900 to 1000° C.) by a process such as sintering of the PSG film 2401, titanium silicide or tungsten silicide may be used. If there is no requirement of anti-impurity diffusion, the PSG film may be of double layer structure with a non-doped CVD film. Furthermore, when a low temperature produced plasma oxide film/nitride film which requires no sintering process is used, the film may be made of titanium silicide or palladium silicide.

Figure 8A:
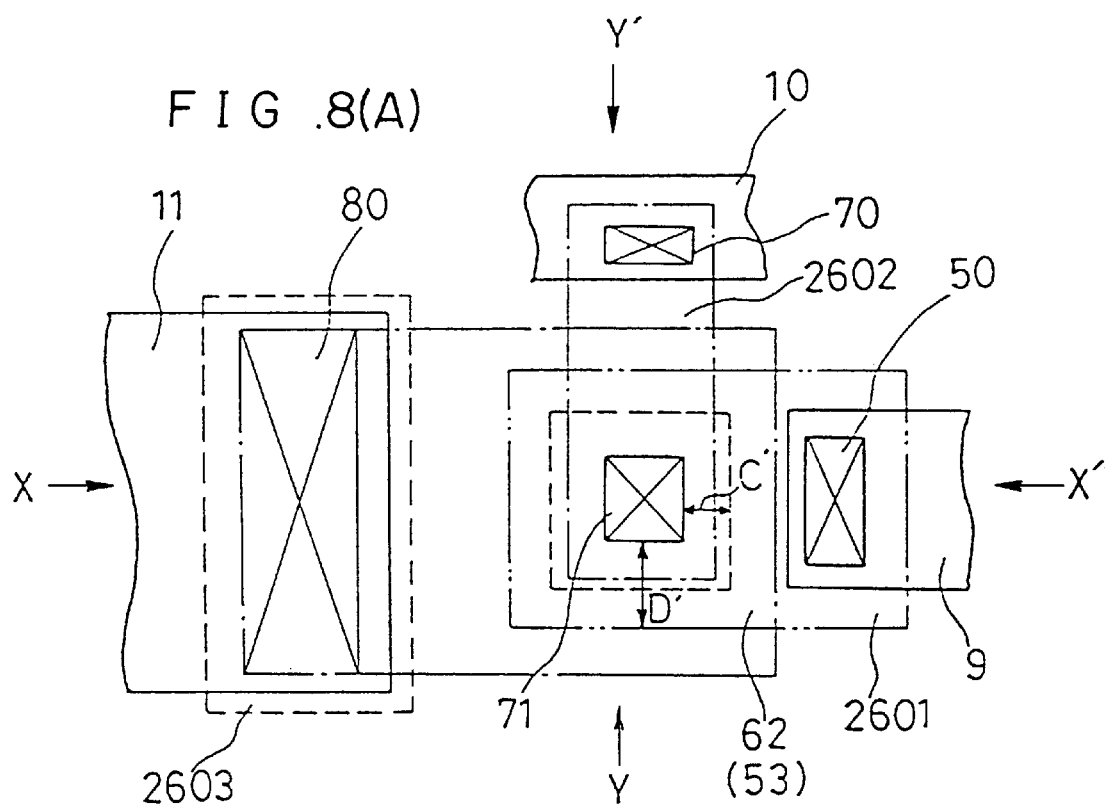
FIG. 8(A) is a diagram showing a plain pattern of a transistor produced by the third embodiment.

FIG. 8(A) shows a plain pattern of a transistor for a semiconductor integrated circuit device which is produced through the above-described production processes. The device corresponds to FIGS. 14 and 16 which show a plain pattern of a transistor produced through the prior art method.

Figure 7C:
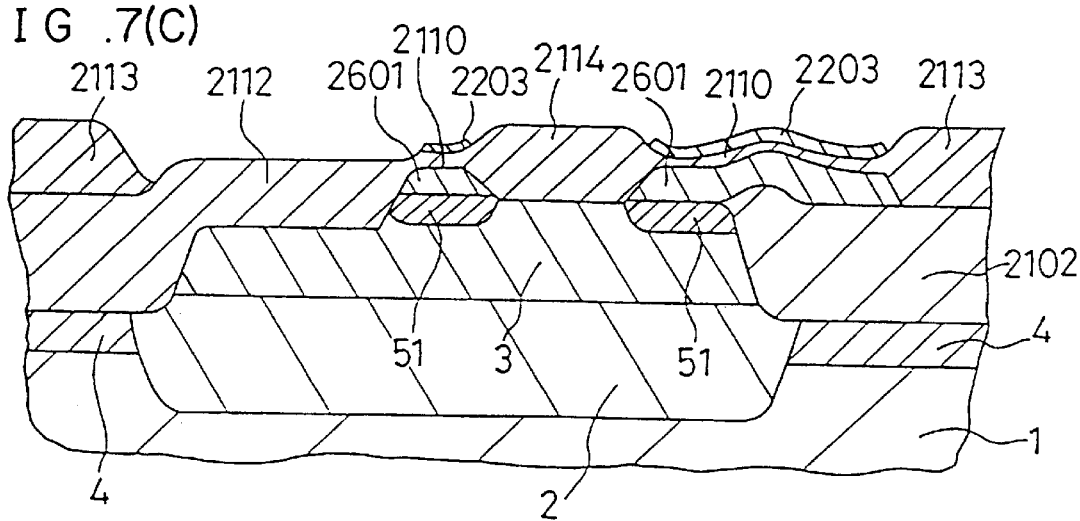
Figure 7H:
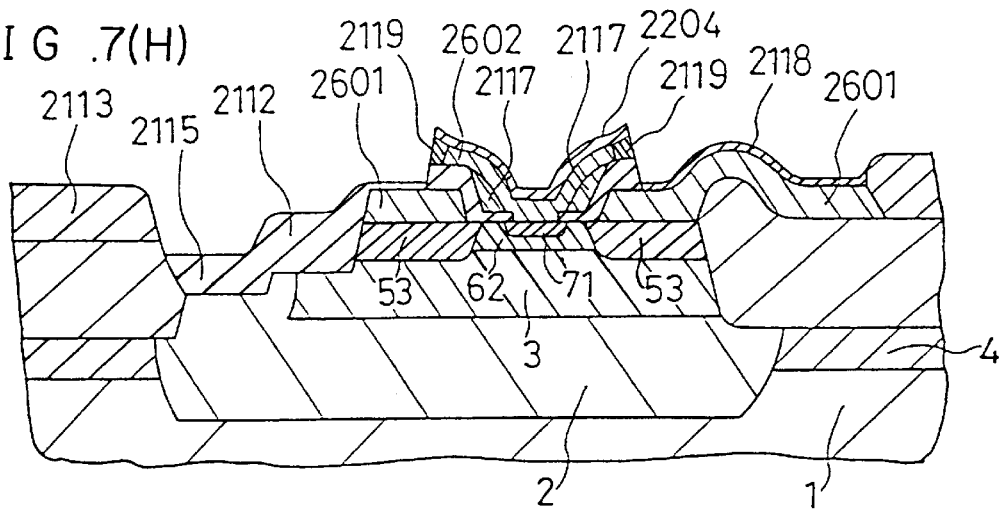
Figure 7I:
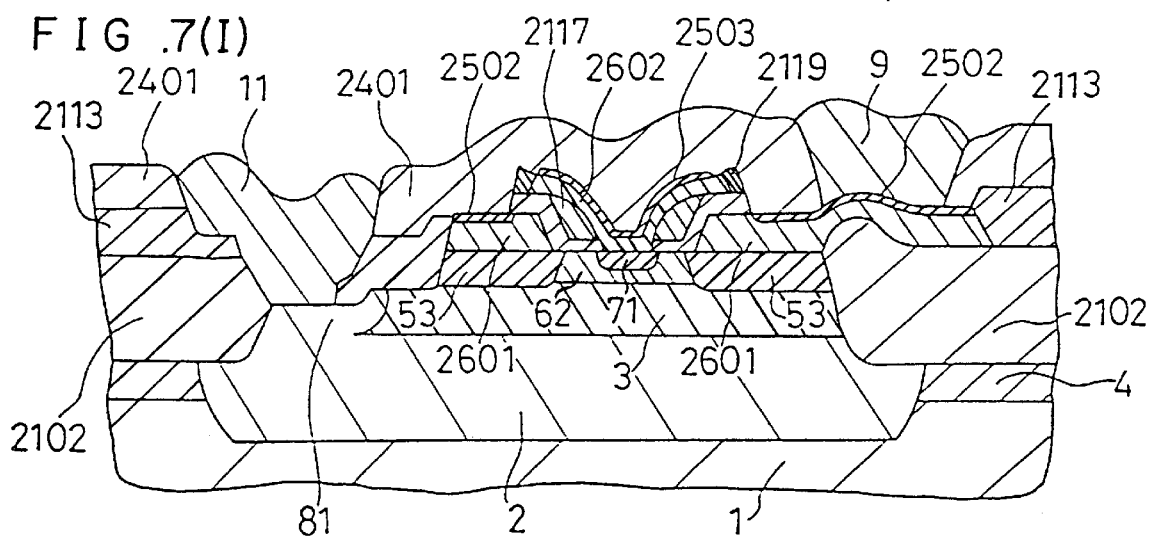

FIG. 8(A) shows a cross-sectional structure taken along the X–X' line of FIG. 7(I). As shown in FIG. 8(A), the distance C' between the external base layer 53 and the emitter layer 71 is self aligned, and thus the base resistance is lowered efficiently. The wiring resistance between the external base layer 53 and the base electrode 9 is lowered to a great extend by the silicide film 2502 on the $p^+$ polysilicon film 2601, and as shown in FIG. 7(I), the contact for the base electrode is located above the oxide film 2102 to reduce the base capacitance to a great extent.

Figure 8B:
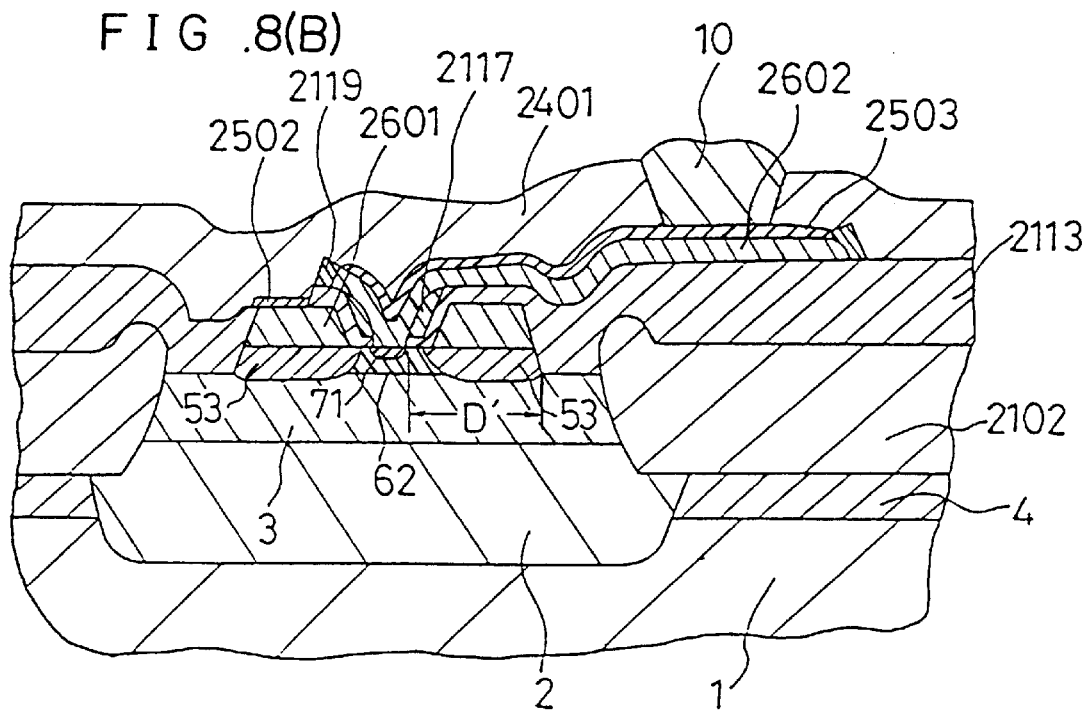
FIG. 8(B) is a diagram showing a cross-sectional structure taken along lines Y–Y' of FIG. 8(A)

FIG. 8(B) shows a cross-sectional structure taken along the line Y–Y' of FIG. 8(A). Herein, the distance D' between the emitter layer 71 and the walled portion (thick oxide film 2113) can be a constant value of a patterning width of the polysilicon film at the photolithography because the thick oxide films 2112 and 2113 are self aligned at the patterning of the polysilicon film 2600 differently from the prior art method.

Furthermore, the external base region 53 is not produced in an extremely unbalanced state at the periphery of the emitter layer 71 as shown in the prior art double base structure of FIG. 17. The external base region 53 is produced at a predetermined distance (equal distance) apart from the emitter layer 71 at the portion of a predetermined distance. From the comparison between FIG. 8(A) and FIG. 17, in the transistor element of the present invention, a reduction to a great extent of a base area results as well as improving the uniformity of parameters such as the base collector capacitance and the base resistance.

Figure 9:
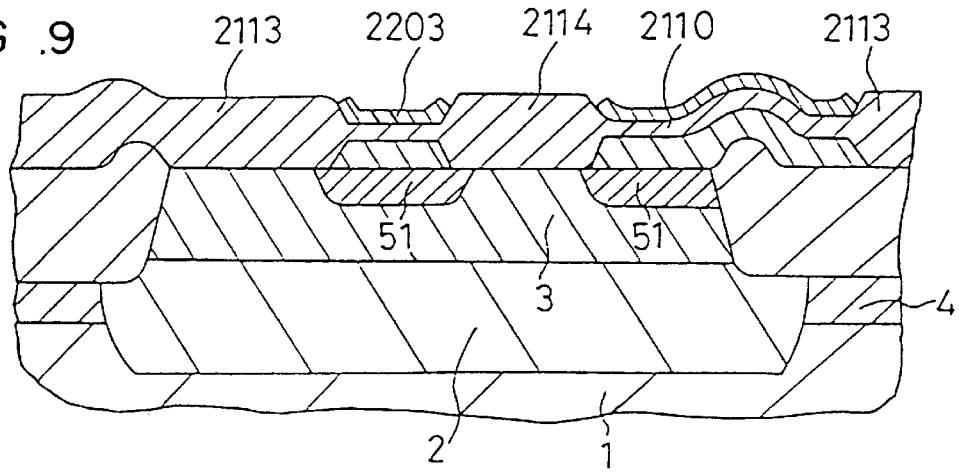
FIG. 9 is a diagram showing a cross-sectional structure at a process step of a method for producing a semiconductor integrated circuit device as an alternative to the third embodiment of the present invention.

Furthermore, the etching of the polysilicon film with the use of the resist film 2301 of FIG. 7(B) in the above-illustrated third embodiment can be deleted by conducting a selective oxidation as shown in FIG. 9 corresponding to FIG. 7(C) to reduce the processes. However, in this case as shown in FIG. 9, the oxide film 2113 in contact with the external base layer 51 is produced on the semiconductor surface, and this increases diffusions into the lateral direction and capacitances of the side walls, which results in lowering the transistor characteristics a small amount.

In the above-illustrated embodiment, the films connected to the external base layer 53, the emitter layer 71, and the collector electrode leading out layer 81 are made of poly-silicon films, but the films may alternately be made of monocrystalline silicon film or amorphous silicon film.

Furthermore, in the above-illustrated third embodiment in order to separate the adjacent transistor layers, an element separation region comprising thick oxide films are produced, but the present invention is not limited thereto. The present invention may be applied to a transistor having a separation region utilizing a trench structure with the same effects as described above.

As is evident from the foregoing description, according to the third embodiment of the present invention, an external base region is produced by impurity diffusions from a silicon film which remains through the selective oxidation process. An active base layer is self-aligned against this silicon film.

The aperture portion for producing the emitter layer is self aligned in accordance with the pattern of the silicon film, whereby the selective oxidation film at the periphery of the silicon film determines the field portion against the transistor. The distance between the emitter layer and the silicon film connected to the base electrode and the distance between the emitter layer and the field portion end portion are reduced to a great extent. This results in a reduction in the base area, a reduction in the base collector capacitance, and a reduction in the base resistance, which results in a semiconductor integrated circuit device produced with a transistor having good frequency characteristics.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A semiconductor integrated circuit device having a bipolar transistor comprising:

a semiconductor layer having a first surface;

a base region having a second surface disposed within said first surface of said semiconductor layer and a third surface opposite to said second surface;

an emitter region diffused into said third surface of said base region, said emitter having a first and second side when viewed as a cross-section perpendicular to said semiconductor integrated circuit device;

said base region including,
      an active base region surrounding said emitter region, and
      an external base region integral with and surrounding said active base region;

a first silicon film disposed over said base region and connected to said external base region, a first portion of said first silicon film being positioned on said first side of said emitter region, and a second portion of said first silicon film being positioned on said second side of said emitter region, and said second portion disposed only on said external base region such that said second portion does not extend beyond said external base region in a horizontal direction going from said first side to said second side;

a first silicide film disposed on said first silicon film;

a base electrode connected to said first silicide film so that said base electrode and said external base region are connected by said first silicon film and said first silicide film;

a second silicon film disposed over said emitter region and connected to said emitter region;

a second silicide film disposed on said second silicon film;

an emitter electrode connected to said second silicide film so that said emitter electrode and said emitter region are connected by said second silicon film and said second silicide film; and an element separation region disposed at a peripheral end of said semiconductor layer, said first portion of said first silicon film extending over said element separation region.

2. A semiconductor integrated circuit device as defined in claim 1, wherein said first silicide film comprises titanium silicide, tungsten silicide, or palladium silicide.

3. A semiconductor integrated circuit device as defined in claim 1, wherein said second silicide film comprises titanium silicide, tungsten silicide, or palladium silicide.

4. A semiconductor integrated circuit device comprising:

a semiconductor layer having a first surface and a peripheral end;

a base region having a second surface disposed within said first surface of said semiconductor layer and a third surface opposite to said second surface;

an emitter region diffused into said third surface of said base region, said emitter having a first and second side when viewed as a cross-section perpendicular to said semiconductor integrated circuit device;

said base region including,
      an active base region surrounding said emitter region, and
      an external base region integral with and surrounding said active base region;

a collector electrode leading out layer disposed within said semiconductor layer;

a first silicon film disposed over a portion of said base region, a first portion of said first silicon film being positioned on said first side of said emitter region, and a second portion of said first silicon film being positioned on said second side of said emitter region, and said second portion disposed only on said external base region such that said second portion does not extend beyond said external base region in a horizontal direction going from said first side to said second side, said first silicon film including an impurity diffusion source therein for forming said external base region;

an oxide film oxidized from said semiconductor layer and disposed on said semiconductor layer between said first silicon film and said collector electrode leading out layer; and an element separation region disposed at said peripheral end of said semiconductor layer, said first portion of said first silicon film extending over said element separation region.

5. A semiconductor integrated circuit device as defined in claim 4, further comprising a second silicon film disposed over said active base region and connected to said emitter region, said second silicon film being formed by a mask which forms both a pattern for a resist film and a pattern for said second silicon film.

6. A semiconductor integrated circuit device as defined in claim 5, further comprising:

a first base electrode connected to said external base region by said first silicon film;

a first silicide film disposed on a top surface of said first silicon film;

an emitter electrode which is connected to said emitter region by said second silicon film; and a second silicide film disposed on a top surface of said second silicon film.

7. A semiconductor integrated circuit device as defined in claim 4, wherein said element separation region comprises a thick insulating film.

8. A semiconductor integrated circuit device as defined in claim 4, wherein said element separation region comprises a trench structure.

9. A semiconductor integrated circuit device as defined in claim 6, wherein said first silicide film comprises titanium silicide, tungsten silicide, or palladium silicide.

10. A semiconductor integrated circuit device as defined in claim 6, wherein said second silicide film comprises titanium silicide, tungsten silicide, or palladium silicide.

11. A semiconductor integrated circuit device having a bipolar transistor comprising:

a semiconductor layer having a first surface;

a base region having a second surface disposed within said first surface of said semiconductor layer and a third surface opposite to said second surface;

an emitter region diffused into said third surface of said base region, said emitter having a first and second side when viewed as a cross-section perpendicular to said semiconductor integrated circuit device;

said base region including,
 an active base region having side walls and surrounding said emitter region, and
 an external base region integral with and surrounding said active base region;

a silicon film disposed over a portion of said base region, a first portion of said silicon film being positioned on said first side of said emitter region, and a second portion of said silicon film being positioned on said second side of said emitter region, and said second portion disposed only on said external base region such that said second portion does not extend beyond said external base region in a horizonal direction going from said first side to said second side, said silicon film connected with said external base region as an impurity diffusion source for forming said external base region;

a first oxide film disposed in contact with a peripheral end of said silicon film; and a second oxide film disposed on said silicon film adjacent to said side walls of said active base layer; and an element separation region disposed at a peripheral end of said transistor, with said first portion of said silicon film being disposed over said element separation region.

12. A semiconductor integrated circuit device as defined in claim 11, wherein said first oxide film comprises a film oxidized from said silicon substrate.

13. A semiconductor integrated circuit device as defined in claim 11, wherein said first oxide film comprises a film oxidized from said silicon film.

14. A semiconductor integrated circuit device comprising:
 a semiconductor layer having a first surface;
  a base region having a second surface disposed within said first surface of said semiconductor layer and a third surface opposite to said second surface;
  an emitter region diffused into said third surface of said base region, said emitter having a first and second side when viewed as a cross-section perpendicular to said semiconductor integrated circuit device, said emitter further including a third side and a fourth side, said first side opposing said second side, said third side opposing said fourth side, and said third and fourth side between said first and second side;
  said base region including,
   an active base region surrounding said emitter region, and
   an external base region integral with and surrounding said active base region;
  a first silicon film disposed over said base region and connected to said external base region, a first portion of said first silicon film being positioned on said first side of said emitter region, and a second portion of said first silicon film being positioned on said second side of said emitter region, and said second portion disposed only on said external base region such that said second portion does not extend beyond said external base region in a horizontal direction going from said first side to said second side, said first silicon film further including a third portion and a fourth portion on said third and fourth sides of said emitter, respectively, which are only disposed on said external base region;

a first silicide film disposed on said first silicon film;

a base electrode connected to said first silicide film so that said base electrode and said external base region are connected by said first silicon film and said first silicide film;

a second silicon film disposed over said emitter region and connected to said emitter region;

a second silicide film disposed on said second silicon film; and an emitter electrode connected to said second silicide film so that said emitter electrode and said emitter region are connected by said second silicon film and said second silicide film.

15. A semiconductor integrated circuit device comprising:

a semiconductor layer having a first surface and a peripheral end;

a base region having a second surface disposed within said first surface of said semiconductor layer and a third surface opposite to said second surface;

an emitter region diffused into said third surface of said base region, said emitter having a first and second side when viewed as a cross-section perpendicular to said semiconductor integrated circuit device, said emitter further including a third side and a fourth side, said first side opposing said second side, said third side opposing said fourth side, and said third and fourth side between said first and second side;

said base region including,
 an active base region surrounding said emitter region, and
 an external base region integral with and surrounding said active base region;

a collector electrode leading out layer disposed within said semiconductor layer:

a first silicon film disposed over a portion of said base region, a first portion of said first silicon film being positioned on said first side of said emitter region, and a second portion of said first silicon film being positioned on said second side of said emitter region, and said second portion disposed only on said external base region such that said second portion does not extend beyond said external base region in a horizontal direction going from said first side to said second side, said first silicon film further including a third portion and a fourth portion on said third and fourth sides of said emitter, respectively, which are only disposed on said external base region; said first silicon film including an impurity diffusion source therein for forming said external base region; and an oxide film oxidized from said semiconductor layer and disposed on said semiconductor layer between said first silicon film and said collector electrode leading out layer.

16. A semiconductor integrated circuit device comprising:

a semiconductor layer having a first surface;

a base region having a second surface disposed within said first surface of said semiconductor layer and a third surface opposite to said second surface;

an emitter region diffused into said third surface of said base region, said emitter having a first and second side when viewed as a cross-section perpendicular to said semiconductor integrated circuit device, said emitter further including a third side and a fourth side, said first side opposing said second side, said third side opposing said fourth side, and said third and fourth side between said first and second side;

said base region including,
 an active base region having side walls and surrounding said emitter region, and
 an external base region integral with and surrounding said active base region;

a silicon film disposed over a portion of said base region, a first portion of said silicon film being positioned on said first side of said emitter region, and a second portion of said silicon film being positioned on said second side of said emitter region, and said second portion disposed only on said external base region such that said second portion does not extend beyond said external base region in a horizontal direction going from said first side to said second side, said silicon film further including a third portion and a fourth portion on said third and fourth sides of said emitter, respectively, which are only disposed on said external base region, said silicon film connected with said external base region as an impurity diffusion source for forming said external base region;

a first oxide film disposed in contact with a peripheral end of said silicon film; and a second oxide film disposed on said silicon film adjacent to said side walls of said active base layer.

17. A semiconductor integrated circuit device having a bipolar transistor comprising:
 a semiconductor layer having a first surface;
 an external base region having a second surface disposed within said first surface of said semiconductor layer and a third surface opposite to said second surface;
 a silicon film disposed over a portion of said base region connected with said external base region as an impurity diffusion source for forming said external base region;
 a first oxide film disposed in contact with said silicon film;
 a nitride film disposed in contact with said first oxide film; and
 said nitride film, said first oxide film, and said silicon film each forming a portion of a side wall of an aperture to expose a portion of said first surface of said semiconductor layer, and said portion of said first surface of said semiconductor layer exposed by said aperture being surrounded by said external base region, wherein
 said aperture has a first and second side when viewed as a cross-section perpendicular to said semiconductor integrated circuit device; and
 said silicon film is disposed on said external base region on both said first and second sides of said aperture such that a portion of said silicon film on one of said first and second sides of said aperture extends beyond a periphery of said external base region.

18. A semiconductor integrated circuit device having a bipolar transistor comprising:

a semiconductor layer having a first surface;

a base region having a second surface disposed within said first surface of said semiconductor layer and a third surface opposite to said second surface;

an emitter region diffused into said third surface of said base region, said emitter having a first and second side when viewed as a cross-section perpendicular to said semiconductor integrated circuit device;

said base region including,
 an active base region surrounding said emitter region, and
 an external base region integral with and surrounding said active base region;

a first silicon film disposed over said base region and connected to said external base region, a first portion of said first silicon film being positioned on said first side of said emitter region, and a second portion of said first silicon film being positioned on said second side of said emitter region, and said second portion disposed only on said external base region such that said second portion does not extend beyond said external base region in a horizontal direction going from said first side to said second side; and an element separation region disposed at a peripheral end of said semiconductor layer, said first portion of said first silicon film extending over said element separation region.

19. A semiconductor integrated circuit device comprising:

a semiconductor layer having a first surface;
 a base region having a second surface disposed within said first surface of said semiconductor layer and a third surface opposite to said second surface;
 an emitter region diffused into said third surface of said base region, said emitter having a first and second side when viewed as a cross-section perpendicular to said semiconductor integrated circuit device, said emitter further including a third side and a fourth side, said first side opposing said second side, said third side opposing said fourth side, and said third and fourth side between said first and second side;
 said base region including,
  an active base region surrounding said emitter region, and
  an external base region integral with and surrounding said active base region;
 a first silicon film disposed over said base region and connected to said external base region, a first portion of said first silicon film being positioned on said first side of said emitter region, and a second portion of said first silicon film being positioned on said second side of said emitter region, and said second portion disposed only on said external base region such that said second portion does not extend beyond said external base region in a horizontal direction going from said first side to said second side, said first silicon film further including a third portion and a fourth portion on said third and fourth sides of said emitter, respectively, which are only disposed on said external base region.

* * * * *